(12) United States Patent
McIntyre et al.

(10) Patent No.: US 9,261,793 B2
(45) Date of Patent: Feb. 16, 2016

(54) IMAGE OPTIMIZATION USING PUPIL FILTERS IN PROJECTING PRINTING SYSTEMS WITH FIXED OR RESTRICTED ILLUMINATION ANGULAR DISTRIBUTION

(75) Inventors: Gregory R. McIntyre, Clifton Park, NY (US); Martin Burkhardt, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 525 days.

(21) Appl. No.: 13/617,981

(22) Filed: Sep. 14, 2012

(65) Prior Publication Data

US 2014/0078479 A1    Mar. 20, 2014

(51) Int. Cl.
*G03B 27/54* (2006.01)
*G03F 7/20* (2006.01)

(52) U.S. Cl.
CPC ........ *G03F 7/70125* (2013.01); *G03F 7/70308* (2013.01); *G03F 7/70325* (2013.01)

(58) Field of Classification Search
CPC ............ G03B 7/70125; G03F 7/70325; G03F 7/70308
USPC ..................................................... 355/67, 77
See application file for complete search history.

(56) References Cited

U.S. PATENT DOCUMENTS

| | | | |
|---|---|---|---|
| 5,595,857 A | 1/1997 | Fukuda et al. | |
| 6,320,648 B1 | 11/2001 | Brueck et al. | |
| 6,377,337 B1 | 4/2002 | Sugita et al. | |
| 6,428,940 B1 | 8/2002 | Sandstrom | |
| 6,555,274 B1 | 4/2003 | Kye et al. | |
| 6,700,649 B2 | 3/2004 | Chandhok et al. | |
| 6,846,617 B2 | 1/2005 | Pierrat | |
| 7,446,873 B2 | 11/2008 | Chandhok | |
| 7,798,676 B2 | 9/2010 | Maul et al. | |
| 8,085,384 B2 | 12/2011 | Ohkubo et al. | |
| 2004/0245439 A1 | 12/2004 | Shaver | |
| 2005/0287483 A1 | 12/2005 | Lercel et al. | |
| 2009/0213354 A1 | 8/2009 | Sandstrom et al. | |

FOREIGN PATENT DOCUMENTS

| | | |
|---|---|---|
| JP | 7134232 | 5/1995 |
| JP | 9199390 | 7/1997 |
| JP | 2001085298 A | 3/2001 |
| JP | 2002025889 A | 1/2002 |
| JP | 2007287719 A | 11/2007 |
| JP | 2009290206 A | 12/2009 |

OTHER PUBLICATIONS

Hector, S., "Pupil Plane Filter for EUV Lithography" Motorola (Jan. 1, 1999) IPCOM000008911D.

*Primary Examiner* — Peter B Kim
(74) *Attorney, Agent, or Firm* — Scully, Scott, Murphy & Presser, P.C.

(57) ABSTRACT

A pupil filter can be designed for any combination of an illumination lens and for various types of lithographic features. The pupil filter can be placed at the pupil plane of a projection optics system. For any given illumination lens providing a pupil fill within a pupil lens, a lithographic mask can be designed for the purpose of printing a one-dimensional array of line and space features or for the purpose of printing a two-dimensional array of contact holes by blocking areas, for each pixel in the pupil fill, the corresponding pixel and diffraction order pixels in the pupil lens unless +1 or −1 diffraction order pixels fall within the area of the numerical aperture. For the purpose of frequency doubling, the pupil fill area is blocked.

20 Claims, 26 Drawing Sheets

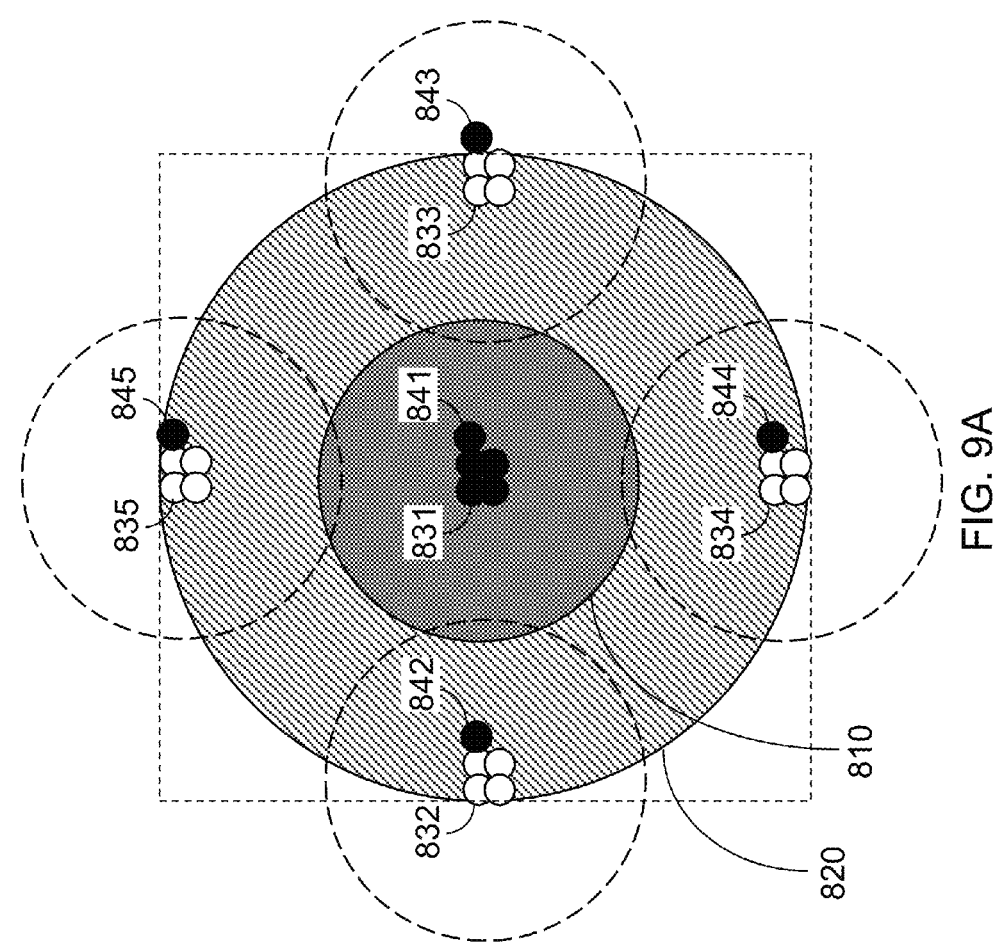

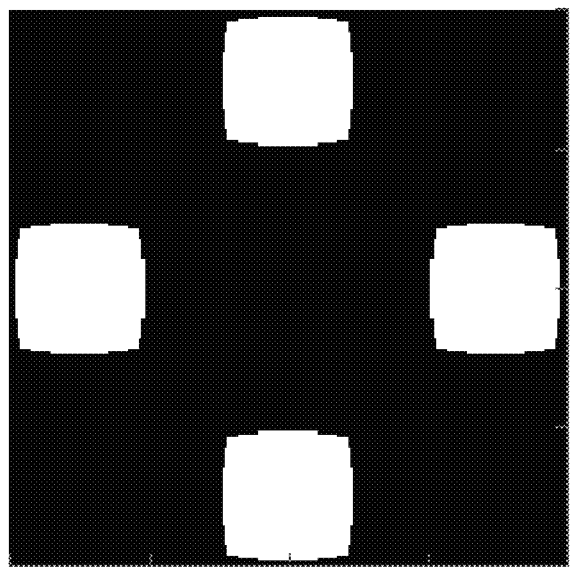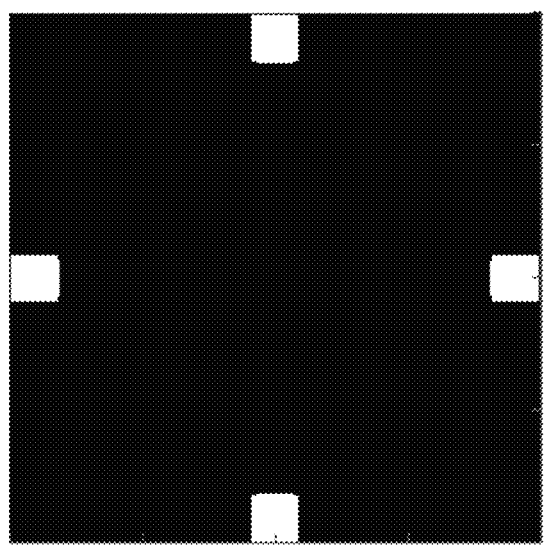
FIG. 9D

Dipole illuminator

Intensity Filter (line-space)

Mask X pitch (nm)

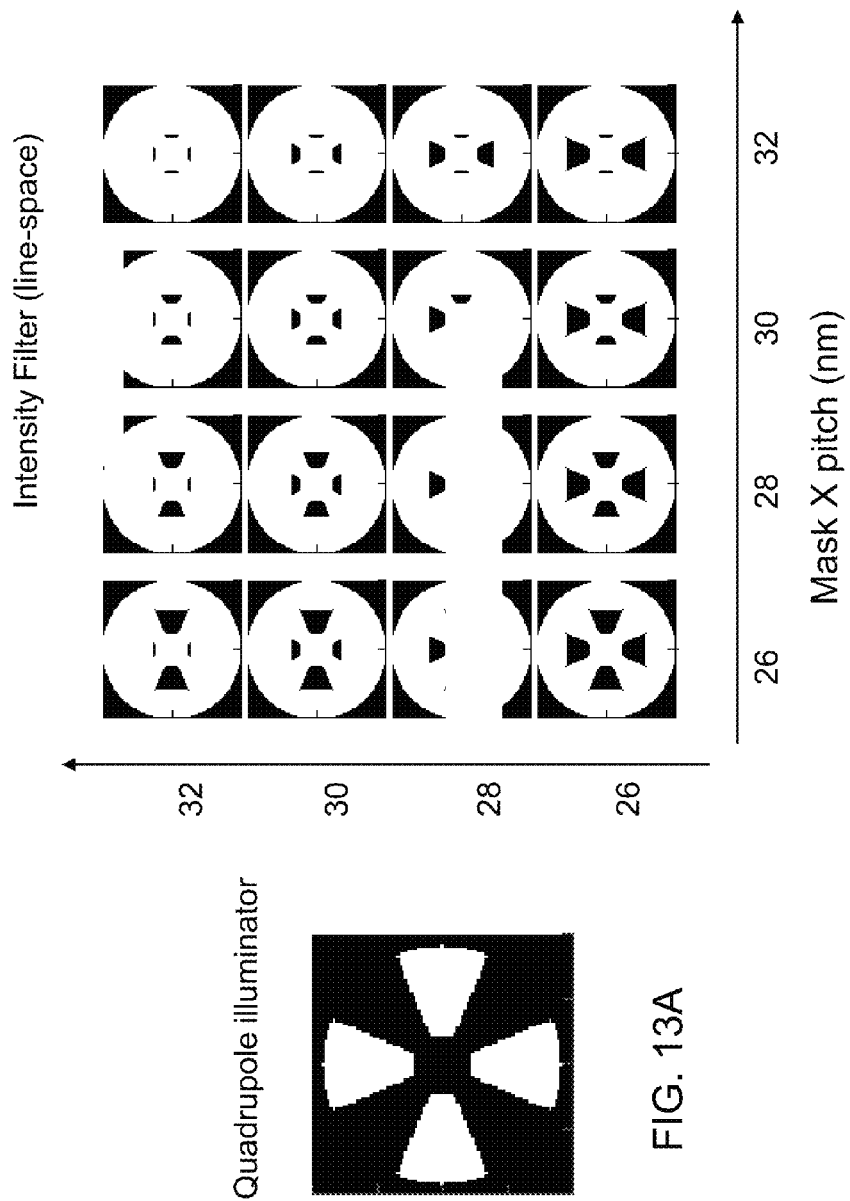

IMAGE OPTIMIZATION USING PUPIL FILTERS IN PROJECTING PRINTING SYSTEMS WITH FIXED OR RESTRICTED ILLUMINATION ANGULAR DISTRIBUTION

BACKGROUND

The present disclosure relates to a method for designing a pattern for a lithographic pupil filter for use with a photomask and photoresist to optimize image resolution or to provide frequency doubling for any illumination lens, a lithographic system that employs a photolithographic mask designed by the same, and a method of operating a lithographic system that employs a photolithographic mask designed by the same.

A systematic method of designing a lithographic pupil filter for an arbitrary illumination condition is desired in order to optimize the resolution of a specific feature to be printed in the photoresist. Particularly, a systematic method of designing a lithographic pupil filter for an arbitrary illumination condition is designed for the purpose of printing a specific one-dimensional array of line and space features, for the purpose of printing a specific two-dimensional array of contact holes, for the purpose of frequency doubling for a specific one-dimensional array of line and spacer features, and for the purpose of frequency doubling for a specific two-dimensional array of contact holes. As used throughout the present disclosure, a "frequency doubling" refers to reducing the pitch by 50% so as to provide a higher frequency (double frequency) at a Fourier transformed space (spatial frequency space) derived from the physical space. With frequency doubling, the wafer pitch will be half that of the mask pitch for 1D linespace patterns in the third embodiment and will be that of the mask pitch multiplied by the square root of two for 2D contact arrays in the fourth embodiment.

SUMMARY

A pupil filter can be designed for any combination of an illumination lens and for various types of lithographic features. The pupil filter can be placed at the pupil plane of a projection lens system, which, depending on the optical system design, may fall within, above, or below the physical lenses in a projection optics system. For imaging lens such as that of an EUV lithographic system, mirrors can serve as lenses. For any given illumination lens providing a pupil fill within a pupil lens, a lithographic mask can be designed for the purpose of printing a one-dimensional array of line and space features or for the purpose of printing a two-dimensional array of contact holes by blocking areas within the projection pupil plane for each pixel in the pupil fill, the corresponding pixel and diffraction order pixels in the pupil lens unless either the +1 or −1 diffraction order pixel beams fall within the area of the numerical aperture. Further, a lithographic mask can be designed for the purpose of frequency-doubling a one-dimensional array of line and space features or for the purpose of printing a two-dimensional array of contact holes by blocking the pupil fill area, and by subsequently blocking areas, for each pixel in the pupil fill, the corresponding pixel and diffraction order pixels in the pupil plane unless all +1 or −1 diffraction order pixels fall within the area of the numerical aperture while not within the source image.

According to an aspect of the present disclosure, a method for generating a design for a resolution enhancing pupil filter for use with a lithographic mask is provided. Employing one or more processor units, each pixel within an area of a source image of a lithographic exposure tool in a pupil coordinate system is selected, one at a time. For each selected pixel within the area of the source image, employing the one or more processor units, and for each of at least one pattern repetition direction in a lithographic mask, locations of a set of a +1 diffraction order pixel and a −1 diffraction order pixel corresponding to a pitch of a periodic pattern in the lithographic mask are determined. Further, for each selected pixel within the area of the source image, employing the one or more processor units, all pixels within the at least one set and within a numerical aperture in the pupil coordinate system are marked as transparent pixels if, for each of the at least one pattern repetition direction, at least one of a corresponding +1 diffraction order pixel and a corresponding −1 diffraction order pixel is within the numerical aperture in a first marking step. In addition, for each selected pixel within the area of the source image, employing the one or more processor units, all pixels within the at least one set and within the numerical aperture in the pupil coordinate system are marked as opaque pixels if, for any of the at least one pattern repetition direction, none of a corresponding +1 diffraction order pixel and a corresponding −1 diffraction order pixel is within the numerical aperture in a second marking step. A pupil filter design is generated, in which all areas corresponding to the transparent pixels are transparent, and all areas corresponding to the opaque pixels are opaque.

According to another aspect of the present disclosure, a system for generating a design for a resolution enhancing pupil filter for use with a lithographic mask is provided. The system includes one or more processor units in communication with a memory and configured to run a program. In the steps of the program, each pixel within an area of a source image of a lithographic exposure tool in a pupil coordinate system is selected, one at a time. For each selected pixel within the area of the source image, and for each of at least one pattern repetition direction in a lithographic mask, locations of a set of a +1 diffraction order pixel and a −1 diffraction order pixel corresponding to a pitch of a periodic pattern in the lithographic mask are determined. All pixels within the at least one set and within a numerical aperture in the pupil coordinate system are marked as transparent pixels if, for each of the at least one pattern repetition direction, at least one of a corresponding +1 diffraction order pixel and a corresponding −1 diffraction order pixel is within the numerical aperture in a first marking step. All pixels within the at least one set and within the numerical aperture in the pupil coordinate system are marked as opaque pixels if, for any of the at least one pattern repetition direction, none of a corresponding +1 diffraction order pixel and a corresponding −1 diffraction order pixel is within the numerical aperture in a second marking step. A pupil filter design is generated in which all areas corresponding to the transparent pixels are transparent, and all areas corresponding to the opaque pixels are opaque.

According to yet another aspect of the present disclosure, a method for generating a design for a frequency doubling pupil filter for use with a lithographic mask is provided. All pixels within an area of a source image of a lithographic exposure tool in a pupil coordinate system are marked as opaque pixels. Employing one or more processor units, each pixel within an area of a source image of a lithographic exposure tool in a pupil coordinate system is selected, one at a time. For each selected pixel within the area of the source image, employing the one or more processor units, and for each of at least one pattern repetition direction in a lithographic mask, locations of a set of a +1 diffraction order pixel and a −1 diffraction order pixel corresponding to a pitch of a periodic pattern in the lithographic mask are determined. Employing the one or more processor units, all pixels within the at least one set and within a numerical aperture in the pupil coordinate system are marked as transparent pixels if, for each of the at least one pattern repetition direction, all of a corresponding +1 diffraction order pixel and a corresponding −1 diffraction order pixel is within the numerical aperture while not within the source image in a first marking step. Employing the one or more processor units, all pixels within the at least one set and within the numerical aperture in the pupil coordinate system are marked as additional opaque pixels if, for any of the at least one pattern repetition direction, at least one of a corresponding +1 diffraction order pixel and a corresponding −1 diffraction order pixel is not within the numerical aperture in a second marking step. A pupil filter design is generated in which all areas corresponding to the transparent pixels are transparent, and all areas corresponding to the opaque pixels and the additional opaque pixels are opaque.

According to still another aspect of the present disclosure, a system for generating a design for a frequency doubling pupil filter for use with a lithographic mask is provided. The system includes one or more processor units in communication with a memory and configured to run a program. In the steps of the program, all pixels within an area of a source image of a lithographic exposure tool in a pupil coordinate system are marked as opaque pixels. Each pixel within an area of a source image of a lithographic exposure tool in a pupil coordinate system is selected, one at a time. For each selected pixel within the area of the source image, and for each of at least one pattern repetition direction in a lithographic mask, locations of a set of a +1 diffraction order pixel and a −1 diffraction order pixel corresponding to a pitch of a periodic pattern in the lithographic mask are determined. All pixels within the at least one set and within a numerical aperture in the pupil coordinate system are marked as transparent pixels if, for each of the at least one pattern repetition direction, all of a corresponding +1 diffraction order pixel and a corresponding −1 diffraction order pixel is within the numerical aperture while not within the source image in a first marking step. All pixels within the at least one set and within the numerical aperture in the pupil coordinate system are marked as additional opaque pixels if, for any of the at least one pattern repetition direction, at least one of a corresponding +1 diffraction order pixel and a corresponding −1 diffraction order pixel is not within the numerical aperture or is within the source image in a second marking step. A pupil filter design is generated, in which all areas corresponding to the transparent pixels are transparent, and all areas corresponding to the opaque pixels and the additional opaque pixels are opaque.

According to even another aspect of the present disclosure, a method of operating a lithographic system is provided. The method includes providing the lithographic exposure tool that includes a pupil lens including a pupil filter having the pupil filter design described above. A substrate with a photoresist layer thereupon is loaded into the lithographic exposure tool. The photoresist layer is lithographically exposed employing the lithographic exposure tool and the pupil lens.

BRIEF DESCRIPTION OF THE SEVERAL VIEWS OF THE DRAWINGS

FIG. 9A is a diagram illustrating determination of whether pixels in a pupil coordinate system is classified as transparent pixels or opaque pixels for frequency doubling according to the fourth embodiment of the present disclosure.

FIG. 9D is an illustration of a method for modifying the pupil filter design according to a variation of the fourth embodiment.

FIG. 13A is a shape of a second non-circular illumination source according to an embodiment of the present disclosure.

FIG. 13B is an illustration of changes in the pupil filter design for frequency doubling as a function of the mask X-pitch for a system employing the second non-circular illumination source of FIG. 12B according to an embodiment of the present disclosure.

DETAILED DESCRIPTION

Figure 1:
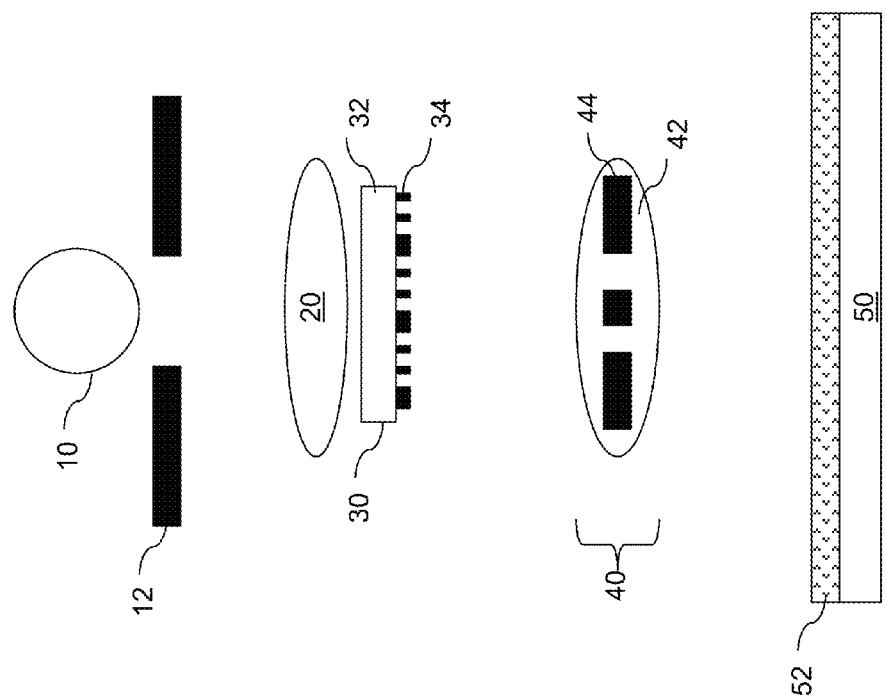
FIG. 1 is a schematic view of an exemplary lithographic apparatus according to an embodiment of the present disclosure.

As stated above, the present disclosure relates to a method for designing a pattern for a lithographic pupil filter for use with a reticle and photoresist to enhance image resolution or to provide frequency doubling for any illumination lens, a lithographic system that employs a photolithographic mask designed by the same, and a method of operating a lithographic system that employs a photolithographic mask designed by the same, which are now described in detail with accompanying figures. It is noted that like and corresponding elements mentioned herein and illustrated in the drawings are referred to by like reference numerals.

Referring to FIG. 1, an exemplary lithographic apparatus that can be employed to implement an embodiment of the present disclosure is schematically illustrated. The exemplary lithographic apparatus is a lithographic exposure system that includes a light source 10, an illuminator 12, a condenser lens 20, a reticle 30 (i.e., a lithographic mask), a projection lens 40, and a substrate 50 with a photoresist layer 52 thereupon. The light source 10, the illuminator 12, the condenser lens 20, and the projection lens 40 can be provided as components of a lithographic exposure tool. The reticle 30 can be inserted and affixed to the lithographic exposure tool. The optimal location for placing the reticle 30 within the lithographic exposure tool is determined by the optics of the lithographic exposure system and is typically at the pupil plane of the condenser lens system. The substrate 50 and the photoresist layer 52 thereupon can be loaded into the lithographic exposure system. The optimal location of the substrate 50 and the photoresist layer 52 is determined by the optics of the lithographic exposure system.

The light source 10 is configured to emit an electromagnetic radiation at a predefined wavelength. The electromagnetic radiation can be an X-ray radiation (having a wavelength in a range from 0.01 nm to 10 nm), or can be an ultraviolet (UV) radiation (having a wavelength in a range from 10 nm to 400 nm).

The illuminator 12 includes an aperture configured to let the electromagnetic radiation from the light source 10 through in a predefined pattern corresponding to the shape of the aperture. The aperture can be circular, elliptical, dipolar, multipolar, or can have any other shape configured to provide optimized lateral distribution of light for the specific pattern in the reticle 30. A system of lenses or mirrors typically serves as an effective aperture to provide the appropriate shape of the illumination incident on the reticle while minimizing as much loss of light as possible.

The reticle 30 is typically located at the pupil plane of the condenser lens system 20, to provide the correct spatial distribution of electromagnetic radiation required for imaging. The reticle 30 can include a transparent substrate 32 and a patterned opaque layer 34. The condenser lens system can be made of a number of transparent optics or, as in the case of EUV lithography, curved multilayer mirror surfaces.

The projection lens 40 includes a lens portion 42 and a pupil filter that include a patterned opaque material layer 44. The projection lens system can be made of a number of transparent optics or, as in the case of EUV lithography, curved multilayer mirror surfaces. As used herein, a material is "transparent" if more than 90% of electromagnetic radiation passes through at a wavelength within the wavelength range from 1 nm to 400 nm, and a material is "opaque" if less than 10% of electromagnetic radiation passes through at a wavelength within the wavelength range from 1 nm to 400 nm. In one embodiment, the pupil filter can be embedded within the transparent lens portion 42.

Figure 2:
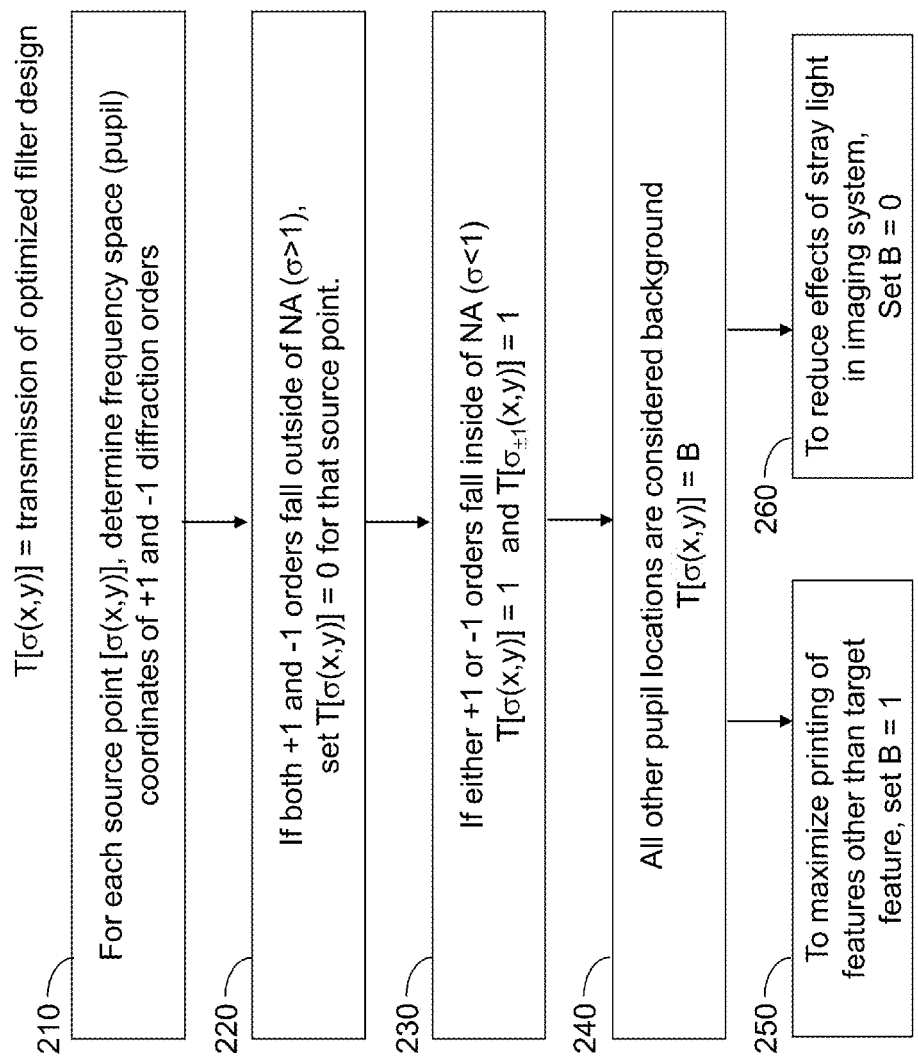
FIG. 2 is a first flow chart for generating a pupil filter design for contrast enhancement according to a first embodiment of the present disclosure.

Referring to FIG. 2, a first flow chart for generating a pupil filter design for contrast enhancement is shown according to a first embodiment of the present disclosure.

Referring to step 210, each pixel within the area of a source image of a lithographic exposure tool in a pupil coordinate system is selected one at a time. As used herein, a "pupil coordinate system" is a normalized two-dimensional coordinate system at the projection lens pupil plane, the plane where the patterned opaque material layer 44 of the projection lens is placed, in which the maximum field of view (i.e., the "numerical aperture") of the rays of the electromagnetic radiation from the light source 10 corresponds to a radius of 1.0. The "pupil coordinate system" of the present disclosure is the same as the system of a "normalized pupil coordinates" as known in the art.

As used herein, a "source image" refers to the area of the direct image (formed only by zeroth order rays, and not by any diffraction order rays) of the light source in the pupil of the projection lens, described in the pupil coordinate system. The source image is defined by the illuminator, and can be circular, elliptical, dipolar, multipolar, or can have any other shape depending on the characteristics of the illuminator system 12.

It is understood that a "pixel" herein refers to any area that is a subdivision of the area of the pupil coordinate system including the numerical aperture. The size of pixels can be selected to enable determination of optical properties of any pupil filter design with sufficient resolution. For example, the size of the pixels can be selected to enable manufacture of a pupil filter implementing a finalized design of a pupil filter without significant loss of performance due to the size of the pixels. The selection of each pixel can be performed by a computing means including one or more processor units, which can be in communication with a memory.

Each pixel in the pupil coordinate system can be represented as a pixel $\sigma(x,y)$. The entire area of the numerical aperture can be represented by a two dimensional Cartesian coordinate $(x, y)$, in which $x^2+y^2 \leq 1$. The distance between the origin of the pupil coordinate system and a pixel $\sigma(x,y)$ can be represented as $|\sigma(x,y)|$, or $\sigma$.

Figure 3A:
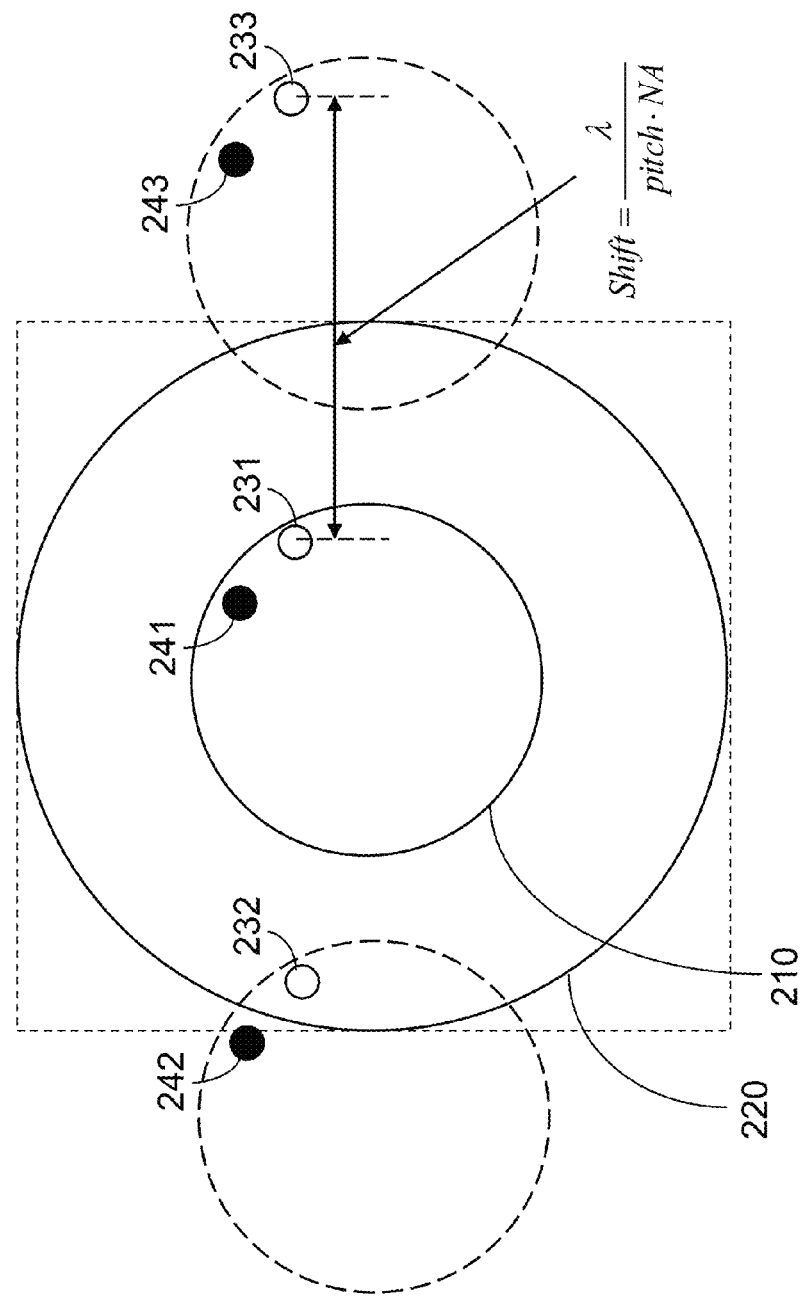
FIG. 3A is a diagram illustrating determination of whether pixels in a pupil coordinate system is classified as transparent pixels or opaque pixels according to the first embodiment of the present disclosure.

Referring to FIG. 3A, a numerical aperture 222 and a source image 212 are shown for an exemplary case in which the illuminator 12 has a circular opening. The dotted rectangle in FIG. 3A represents a possible shape that can be used as the outside edge of a pupil filter. The lithographic mask can include at least one pattern repetition direction, i.e., a direction along which a pattern is periodically repeated. The at least one pattern repetition direction can be a single direction, or can be two directions that are different from each other. In one embodiment, a lithographic pattern in the reticle 30 (See FIG. 1) can include a one-dimensional array of periodic patterns having a periodicity in one direction. In one embodiment, the at least one pattern repetition direction consists of a single direction, and the periodic pattern is a one-dimensional array of repetitions of a line and a space.

For each selected pixel from within the source image, and for each of at least one pattern repetition direction in the lithographic mask, locations of a set of a +1 diffraction order pixel and a −1 diffraction order pixel corresponding to the pitch of the periodic pattern in the lithographic mask are determined. If the lithographic pattern includes a single pattern repetition direction, locations of a single set of a +1 diffraction order pixel and a −1 diffraction order pixel corresponding to the pitch of the periodic pattern in the lithographic mask are determined for the selected pixel. In this embodiment, a "+1 diffraction order pixel" is the pixel laterally spaced from the selected pixel by a shift of $\lambda/(pitch \cdot NA)$ along a direction of a pattern repetition direction, in which $\lambda$ is the wavelength of the electromagnetic radiation emitted from the illumination source 10 (See FIG. 1), and "pitch" refers to the pitch of the periodic pattern along the pattern repetition direction. The coordinate of a +1 diffraction order pixel for a selected pixel $\sigma(x,y)$ is herein represented as $\sigma_{+1}(x,y)$. In this embodiment, a "−1 diffraction order pixel" is the pixel laterally spaced from the selected pixel by a shift of $\lambda/(pitch \cdot NA)$ in the opposite direction of the shift of the +1 diffraction order pixel relative to the selected pixel. The coordinate of a −1 diffraction order pixel for a selected pixel $\sigma(x,y)$ is herein represented as $\sigma_{-1}(x,y)$. The coordinates of a +1 diffraction order pixel and a −1 diffraction order pixel are collectively represented as $\sigma_{\pm 1}(x,y)$.

In an illustrative example, the direction of periodicity of the one-dimensional array of periodic patterns can correspond to the X-direction (horizontal direction) in FIG. 3A. For each selected pixel within the area of the source image 210 of the lithographic exposure tool in the pupil coordinate system, the coordinates of a +1 diffraction order pixel and a −1 diffraction order pixel, as represented by pixels in the pupil coordinate system, can be determined. For example, the one-dimensional array of periodic patterns can be a periodic pattern of a line and a space with a pitch, which is referred to as a "pitch" in FIG. 3A.

Referring to step 220 of FIG. 2, the selected pixel and all pixels within the at least one set of the +1 diffraction order pixel and the −1 diffraction order pixel and within the numerical aperture in the pupil coordinate system are marked as transparent pixels if, for each of the at least one pattern repetition direction, at least one of a corresponding +1 diffraction order pixel and a corresponding −1 diffraction order pixel is within the numerical aperture 222. If there is only one pattern repetition direction, there is only one set of the +1 diffraction order pixel and the −1 diffraction order pixel. In this case, the selected pixel and all pixels within the set of the +1 diffraction order pixel and the −1 diffraction order pixel and within the numerical aperture 222 in the pupil coordinate system are marked as transparent pixels if, for the pattern repetition direction, at least one of a corresponding +1 diffraction order pixel and a corresponding −1 diffraction order pixel is within the numerical aperture 222. For example, for each selected pixel 231 for which at least one of a +1 diffraction order pixel 232 and a −1 diffraction order pixel 233 is located within the numerical aperture 222, the selected pixel 231 and the corresponding +1 diffraction order pixel 232 and the corresponding −1 diffraction order pixel 233 within the numerical aperture 222 (e.g., the selected pixel 231 and the +1 diffraction order pixel 232 only in the illustrated example of FIG. 3A) are marked as transparent pixels.

As used herein, the location of a pixel is determined by the center point of the pixel. For example, a pixel is considered to be located outside the numerical aperture if the center point of the pixel is located outside the numerical aperture. While the pixels illustrated in the drawings of the instant application are circular, the shape of the pixels can be rectangular, hexagonal, or of any other shape as known in the art.

In one embodiment, the transmission T of the optimized filter design can be a function of the coordinates in the pupil coordinate system. In this case, the transmission of a pupil filter design is set to 1 at the selected source pixel (i.e., $T[\sigma(x,y)]=1$), the transmission of the pupil filter design is set to 1 at the +1 diffraction order pixel (i.e., $T[\sigma_{+1}(x,y)]=1$) if the +1 diffraction order pixel is within the numerical aperture 222, and the transmission of the pupil filter design is set to 1 at the −1 diffraction order pixel (i.e., $T[\sigma_{-1}(x,y)]=1$) if the −1 diffraction order pixel is within the numerical aperture 222. This step can be performed employing one or more processing units of the computing means.

Referring to step 230 of FIG. 2, the selected pixel is are marked as opaque pixels if, for any of the at least one pattern repetition direction, none of a corresponding +1 diffraction order pixel and a corresponding −1 diffraction order pixel is within the numerical aperture 222. If there is only one pattern repetition direction, there is only one set of the +1 diffraction order pixel and the −1 diffraction order pixel. In this case, the selected pixel is marked as an opaque pixel if, for any of the at least one pattern repetition direction, none of a corresponding +1 diffraction order pixel and a corresponding −1 diffraction order pixel is within the numerical aperture 222. For example, for each selected pixel 241 for which both of a +1 diffraction order pixel 232 and a −1 diffraction order pixel 233 are located outside the numerical aperture 222, the selected pixel 241 is marked as opaque pixels.

It is noted that the corresponding +1 diffraction order pixel 242 and the corresponding −1 diffraction order pixel 243 are located outside the numerical aperture 222. This feature can be advantageously employed for the purpose of providing a program to be run on a computing means. For example, a program for performing the method of the present disclosure can include a step that performs a step in which, for each selected pixel 241 for which both of a +1 diffraction order pixel 232 and a −1 diffraction order pixel 233 are located outside the numerical aperture 222, the selected pixel 241 and the corresponding +1 diffraction order pixel 242 and the corresponding −1 diffraction order pixel 243 within the numerical aperture 222 are marked as opaque pixels. The limitation that the pixels to be marked as opaque pixels be located within the numerical aperture removes the +1 diffraction order pixel 242 and the −1 diffraction order pixel 243 from a list of pixels to be marked as opaque pixels.

In other words, for each selected pixel 241 for which both of a +1 diffraction order pixel 232 and a −1 diffraction order pixel 233 are located outside the numerical aperture 222, the transmission of a pupil filter design is set to 0 at the selected source pixel (i.e., $T[\sigma(x,y)]=0$). This step can be performed employing one or more processing units of the computing means.

Referring to step 240 of FIG. 2, all other pixels within the pupil coordinate system are marked (designated) as background pixels, and are assigned a value of "B." In other words, for all pixels $\sigma(x,y)$ that are not within the source image 212, not one of the +1 diffraction order pixels, and not one of the −1 diffraction order pixels, the transmission of that pixel is set to "B" (i.e., $T[\sigma(x,y)]=B$).

Figure 3B:
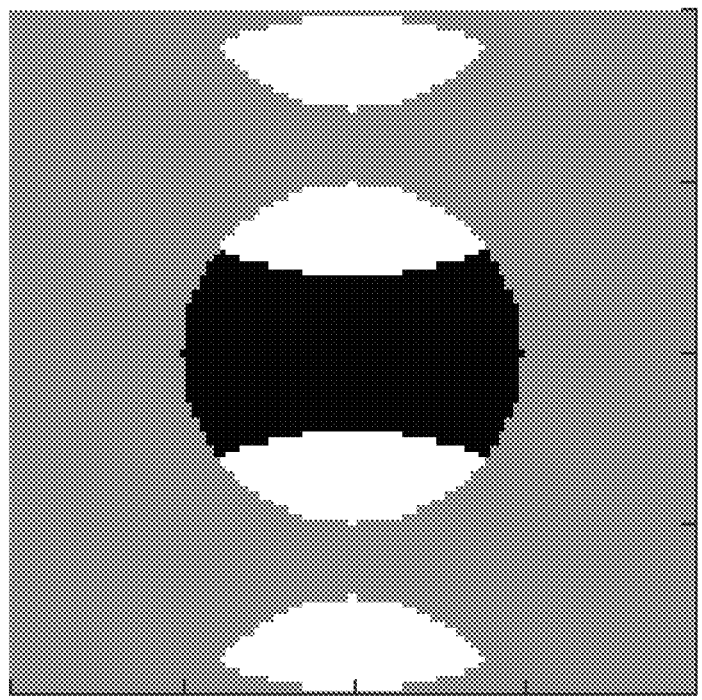
FIG. 3B is an exemplary pupil filter design according to first embodiment of the present disclosure.

A pupil filter design is generated such that all areas corresponding to the transparent pixels are transparent, and all areas corresponding to the opaque pixels are opaque. An exemplary pupil filter design generated by this method is shown in FIG. 3B, in which the dark area represents an opaque area, the white areas represent transparent areas, and the grey area represents the area marked as a background area having "B" as the value of the transmission.

Referring to step 250 of FIG. 2, if it is more desirable to maximize printing of features other than the target feature having the periodically repeated patterns on the reticle than to reduce the effects of stray light in the lithographic exposure system, the value of the background "B" is set to 1 to complete the design of the pupil filter. Thus, in the design for a pupil filter, the areas including pixels that are not a +1 diffraction order pixel or a −1 diffraction order pixel for any of the selected pixels are set as transparent areas in the pupil filter design.

Figure 3D:
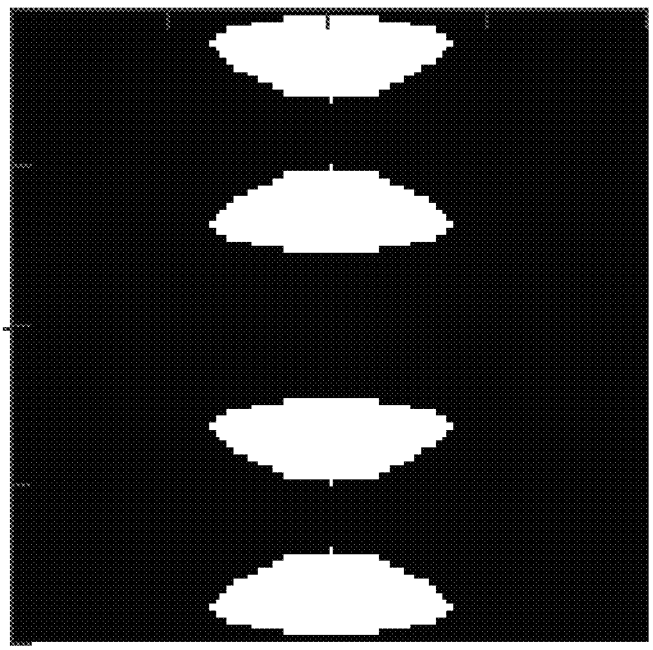
FIG. 3D is an exemplary pupil filter design for minimizing the effects of stray lights according to the first embodiment of the present disclosure.
Figure 3C:
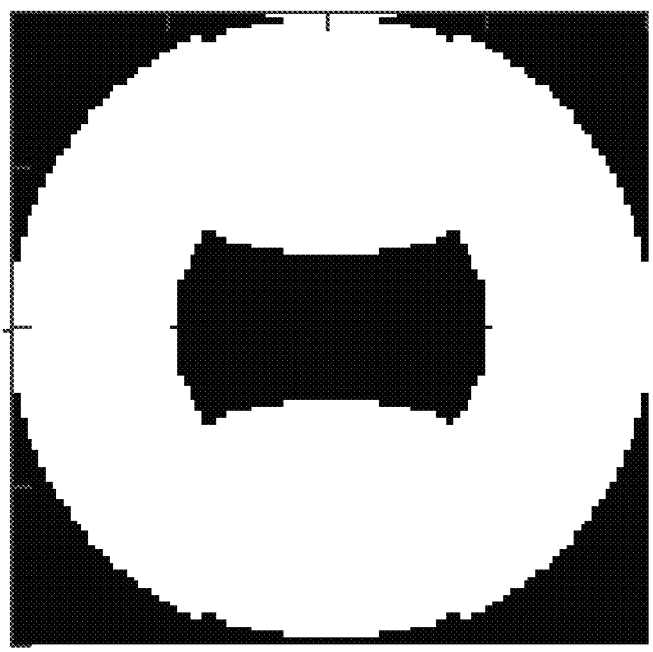
FIG. 3C is an exemplary pupil filter design for maximizing printing of other features than target features according to the first embodiment of the present disclosure.

FIG. 3C represents an example of a pupil filter design in which the portion of the background area within the numerical aperture 222 is transparent, and the portion of the background area outside the numerical aperture 222 is opaque. It is noted that the transmission of the area outside the numerical aperture 222 has no impact on the image because rays of light impinging outside the numerical aperture 222 do not reach the photoresist 52 on the substrate 50 (See FIG. 1).

Referring to step 260 of FIG. 2, if it is more desirable to reduce the effects of stray light in the lithographic exposure system than to maximize printing of features other than the target feature having the periodically repeated patterns on the reticle, the value of the background "B" is set to 0 to complete the design of the pupil filter. Thus, in the design for a pupil filter, areas including pixels that are not a +1 diffraction order pixel or a −1 diffraction order pixel for any of the selected pixels as opaque areas in the pupil filter design.

FIG. 3D represents an example of a pupil filter design in which the entirety of the background area is opaque.

In some embodiments of the present disclosure, various portions of the background area can be assigned different values of transmission.

It is noted that the transmission of the area outside the numerical aperture 222 has no impact on the image because rays of light impinging outside the numerical aperture 222 do not reach the photoresist 52 on the substrate 50 (See FIG. 1).

Figure 3E:
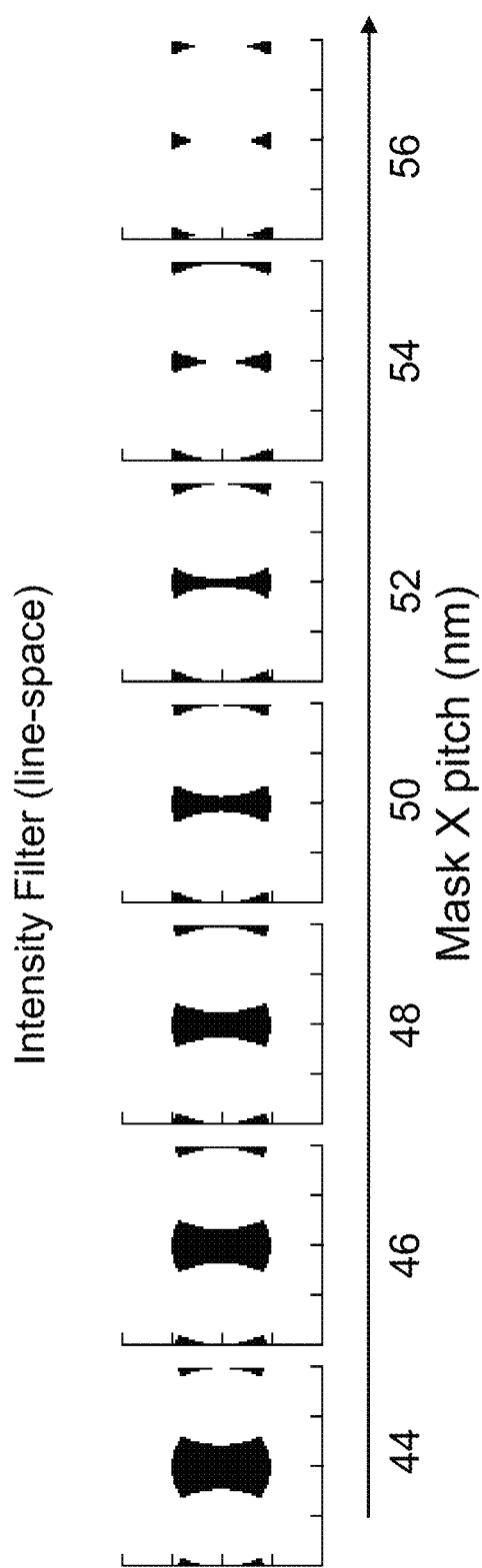
FIG. 3E is an illustration of changes in the pupil filter design for contrast enhancement as a function of the mask pitch of a one-dimensional array of lines and spaces according to the first embodiment of the present disclosure.

Referring to FIG. 3E, changes in the pupil filter design for contrast enhancement are illustrated as a function of the mask pitch of a one-dimensional array of lines and spaces. As used herein, a "mask pitch" refers to the pitch of the periodic features on a lithographic substrate divided by the image reduction factor of the lithographic exposure system, which is the ratio of the periodicity of lithographic features on a lithographic mask divided by the periodicity of the corresponding printed lithographic image as printed on a photoresist. All examples illustrated are designed for a 13.5 nm wavelength EUV lithography system with a 0.25 Numerical aperture.

In one embodiment, a lithographic system can include the lithographic exposure tool of FIG. 1A. A pupil filter 40 (See FIG. 1) employing the pupil filter design provided in the flow chart of FIG. 2 can be employed in the lithographic system. Once such a lithographic system is provided, a substrate 50 with a photoresist layer 52 thereupon can be loaded into the lithographic exposure tool. The photoresist layer 52 can be subsequently lithographically exposed employing the lithographic exposure tool and the pupil filter 40 according to an embodiment of the present disclosure. Such a pupil filter 40 can optimize the contrast of printed images on the photoresist, i.e., the printed lithographic features on the photoresist layer 52 has greater contrast than a comparable printed image employing the same reticle and a pupil lens that does not include a pupil filter.

Figure 4:
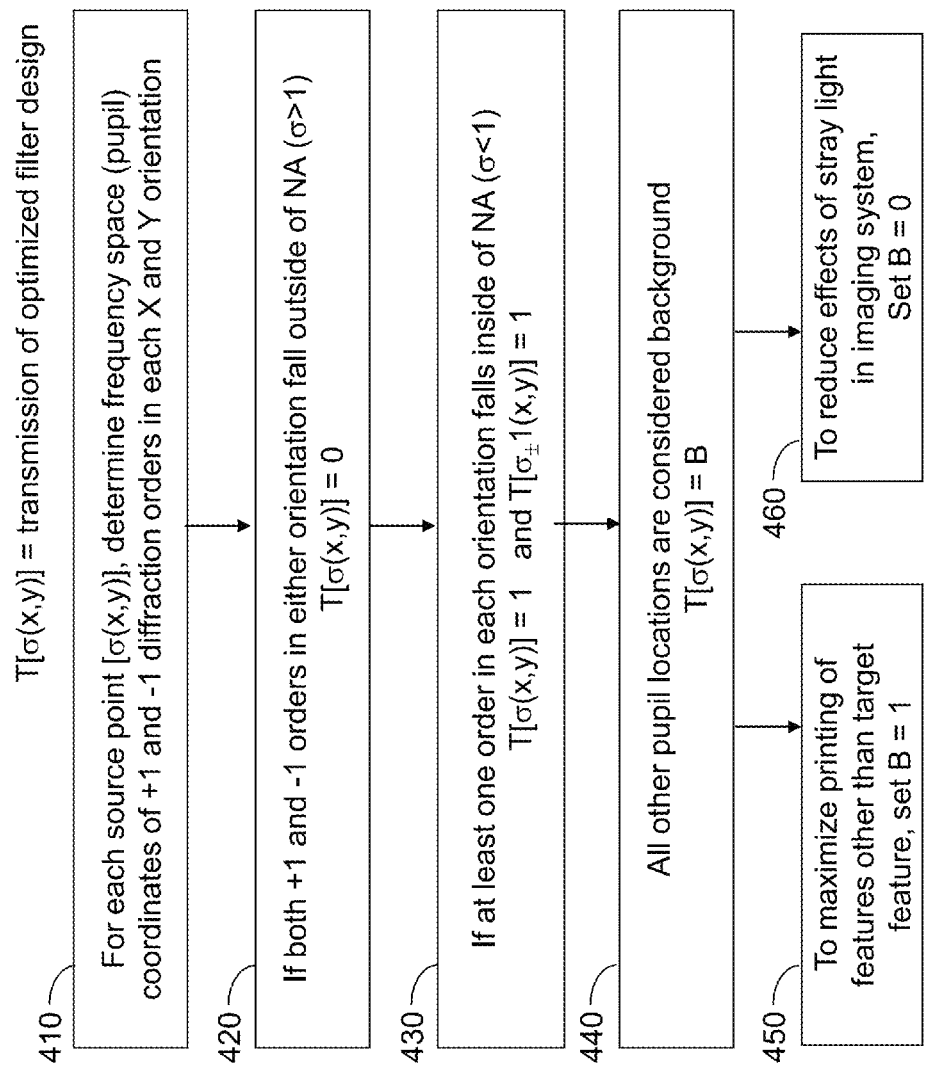
FIG. 4 is a second flow chart for generating a pupil filter design for contrast enhancement according to a second embodiment of the present disclosure.

Referring to FIG. 4, a second flow chart for generating a pupil filter design for contrast enhancement is shown according to a second embodiment of the present disclosure. Referring to step 410, each pixel within the area of a source image of a lithographic exposure tool in a pupil coordinate system is selected one at a time.

Each pixel in the pupil coordinate system can be represented as a pixel $\sigma(x,y)$. The entire area of the numerical aperture can be represented by a two dimensional Cartesian coordinate $(x, y)$, in which $x^2+y^2 \leq 1$. The distance between the origin of the pupil coordinate system and a pixel $\sigma(x,y)$ can be represented as $|\sigma(x,y)|$, or $\sigma$.

Figure 5A:
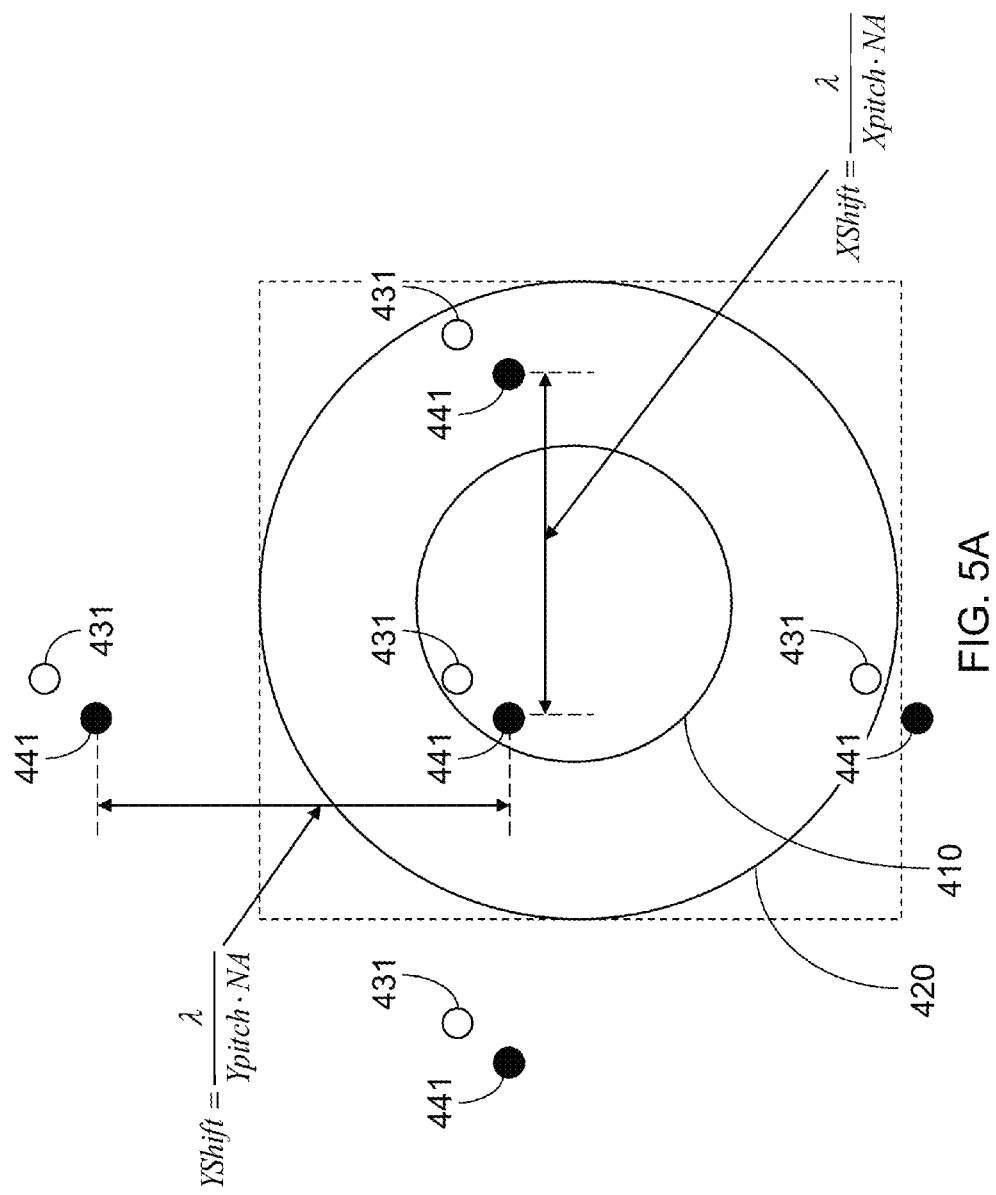
FIG. 5A is a diagram illustrating determination of whether pixels in a pupil coordinate system is classified as transparent pixels or opaque pixels according to the second embodiment of the present disclosure.

Referring to FIG. 5A, a numerical aperture 422 and a source image 412 are shown for an exemplary case in which the illuminator 12 (See FIG. 1) has a circular shape. The dotted rectangle in FIG. 5A represents a possible shape that can be used as the outside edge of a pupil filter. The lithographic mask can include at least one pattern repetition direction, i.e., a direction along which a pattern is periodically repeated. The at least one pattern repetition direction can be a single direction, or can be two directions that are orthogonal to each other. In one embodiment, a lithographic pattern in the reticle 30 (See FIG. 1) can include a two-dimensional array of periodic patterns having a periodicity in two directions. In one embodiment, the at least one pattern repetition direction includes two directions, and the periodic pattern is a two-dimensional array of contact holes.

For each selected pixel from within the source image, and for each of at least one pattern repetition direction in the lithographic mask, locations of a set of a +1 diffraction order pixel and a −1 diffraction order pixel corresponding to the pitch of the periodic pattern in the lithographic mask are determined. If the lithographic pattern includes two pattern repetition directions, locations of two sets of a +1 diffraction order pixel and a −1 diffraction order pixel corresponding to each pitch of the periodic pattern in the lithographic mask are determined for the selected pixel. In this embodiment, a "+1 diffraction order pixel" is the pixel laterally spaced from the selected pixel by a shift of $\lambda/(Xpitch \cdot NA)$ along the x direction (one of the two pattern repetition directions) or the pixel laterally spaced from the selected pixel by a shift of $\lambda/(Ypitch \cdot NA)$ along the y direction (another of the two pattern repetition directions). $\lambda$ is the wavelength of the electromagnetic radiation emitted from the illumination source 10 (See FIG. 1A), "Xpitch" refers to the pitch of the periodic pattern along the x direction, and "Ypitch" refers to the pitch of the periodic pattern along the y direction. The coordinate of each +1 diffraction order pixel for a selected pixel $\sigma(x,y)$ is herein represented as $\sigma_{+1}(x,y)$. In this embodiment, a "−1 diffraction order pixel" is the pixel laterally spaced from the selected pixel by a shift of $\lambda/(Xpitch \cdot NA)$ in the opposite direction of the shift of the +1 diffraction order pixel that is shifted by $\lambda/(Xpitch \cdot NA)$ along the x direction relative to the selected pixel, or the pixel laterally spaced from the selected pixel by a shift of $\lambda/(Ypitch \cdot NA)$ in the opposite direction of the shift of the +1 diffraction order pixel that is shifted by $\lambda/(Ypitch \cdot NA)$ along the y direction relative to the selected pixel. The coordinate of each −1 diffraction order pixel for a selected pixel $\sigma(x,y)$ is herein represented as $\sigma_{-1}(x,y)$. The coordinates of a +1 diffraction order pixel and a −1 diffraction order pixel are collectively represented as $\sigma_{\pm1}(x,y)$.

For each selected pixel within the area of the source image 412 of the lithographic exposure tool in the pupil coordinate system, the coordinates of +1 diffraction order pixels and −1 diffraction order pixels, as represented by pixels in the pupil coordinate system, can be determined. For example, the two-dimensional array of periodic patterns can be a periodic pattern of contact holes having a periodicity of "Xpitch" along the x direction and having a periodicity of "Ypitch" along the y direction in FIG. 5A.

Referring to step 420 of FIG. 4, the selected pixel and all pixels within the at least one set of the +1 diffraction order pixel and the −1 diffraction order pixel and within the numerical aperture in the pupil coordinate system are marked as transparent pixels if, for each of the at least one pattern repetition direction, at least one of a corresponding +1 diffraction order pixel and a corresponding −1 diffraction order pixel is within the numerical aperture 422. If there are two pattern repetition directions, there exist two sets of a +1 diffraction order pixel and a −1 diffraction order pixel. In this case, the selected pixel and all pixels within the two sets of the +1 diffraction order pixel and the −1 diffraction order pixel and within the numerical aperture 422 in the pupil coordinate system are marked as transparent pixels if, for each pattern repetition direction, at least one of a corresponding +1 diffraction order pixel and a corresponding −1 diffraction order pixel is within the numerical aperture 422. For example, for each selected pixel 431 for which at least one of a +1 diffraction order pixel 432 and a −1 diffraction order pixel 433 along the x direction is located within the numerical aperture 422 and for which at least one of a +1 diffraction order pixel 434 and a −1 diffraction order pixel 435 along the y direction is located within the numerical aperture 422, the selected pixel 431 and the corresponding +1 diffraction order pixels (432, 434) and the corresponding −1 diffraction order pixels (433, 435) within the numerical aperture 422 (e.g., the +1 diffraction order pixel 432 and the −1 diffraction order pixel 435 only in the illustrated example of FIG. 5A) are marked as transparent pixels.

In one embodiment, the transmission T of the optimized filter design can be a function of the coordinates in the pupil coordinate system. In this case, the transmission of a pupil filter design is set to 1 at the selected source pixel (i.e., $T[\sigma(x,y)]=1$), the transmission of the pupil filter design is set to 1 at each +1 diffraction order pixel (i.e., $T[\sigma_{+1}(x,y)]=1$) if the +1 diffraction order pixel is within the numerical aperture 422, and the transmission of the pupil filter design is set to 1 at each −1 diffraction order pixel (i.e., $T[\sigma_{-1}(x,y)]=1$) if the −1 diffraction order pixel is within the numerical aperture 422. This step can be performed employing one or more processing units of the computing means.

Referring to step 430 of FIG. 4, the selected pixel is marked as opaque pixels if, for any of the at least one pattern repetition direction, none of a corresponding +1 diffraction order pixel and a corresponding −1 diffraction order pixel is within the numerical aperture 422. If there are two pattern repetition directions, there exist two sets of a +1 diffraction order pixel and a −1 diffraction order pixel for the selected pixel. In this case, the selected pixel is marked as opaque, for any of the at least one pattern repetition direction, none of a corresponding +1 diffraction order pixel and a corresponding −1 diffraction order pixel is within the numerical aperture 422. For example, for each selected pixel 441 for which both of a +1 diffraction order pixel 432 and a −1 diffraction order pixel 433 in a first set of diffraction order pixels are located outside the numerical aperture 422 or for which both of a +1 diffraction order pixel 434 and a −1 diffraction order pixel 435 in a second set of diffraction order pixels are located outside the numerical aperture 422, the selected pixel 441 is marked as opaque pixels. In the illustrated example of FIG. 5, both of a +1 diffraction order pixel 434 and a −1 diffraction order pixel 435 in the second set of diffraction order pixels are located outside the numerical aperture 422. Thus, the selected pixel 441 and the +1 diffraction order pixel 442 located within the numerical aperture 422 are marked as opaque points.

In other words, for each selected pixel 441 for which both of a +1 diffraction order pixel 432 and a −1 diffraction order pixel 433 in a first set of diffraction order pixels are located outside the numerical aperture 422 or for which both of a +1 diffraction order pixel 434 and a −1 diffraction order pixel 435 in a second set of diffraction order pixels are located outside the numerical aperture 422, the transmission of a pupil filter design is set to 0 at the selected source pixel (i.e., $T[\sigma(x,y)]=0$). This step can be performed employing one or more processing units of the computing means.

Referring to step 440 of FIG. 4, all other pixels within the pupil coordinate system are marked (designated) as background pixels, and are assigned a value of "B." In other words, for all pixels $\sigma(x,y)$ that are not within the source image 412, not one of the +1 diffraction order pixels, and not one of the −1 diffraction order pixels, the transmission of that pixel is set to "B" (i.e., $T[\sigma(x,y)]=B$).

Figure 5B:
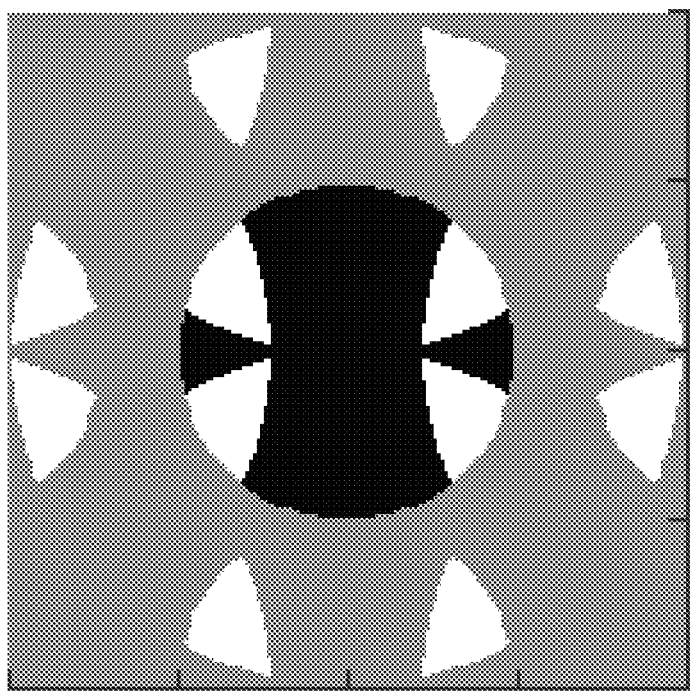
FIG. 5B is an exemplary pupil filter design according to second embodiment of the present disclosure.

A pupil filter design is generated such that all areas corresponding to the transparent pixels are transparent, and all areas corresponding to the opaque pixels are opaque. An exemplary pupil filter design generated by this method is shown in FIG. 5B, in which the dark area represents an opaque area, the white areas represent transparent areas, and the grey area represents the area marked as a background area having "B" as the value of the transmission.

Referring to step 450 of FIG. 4, if it is more desirable to maximize printing of features other than the target feature having the periodically repeated patterns on the reticle than to reduce the effects of stray light in the lithographic exposure system, the value of the background "B" is set to 1 to complete the design of the pupil filter. Thus, in the design for a pupil filter, the areas including pixels that are not a +1 diffraction order pixel or a −1 diffraction order pixel for any of the selected pixels are set as transparent areas in the pupil filter design.

Figure 5D:
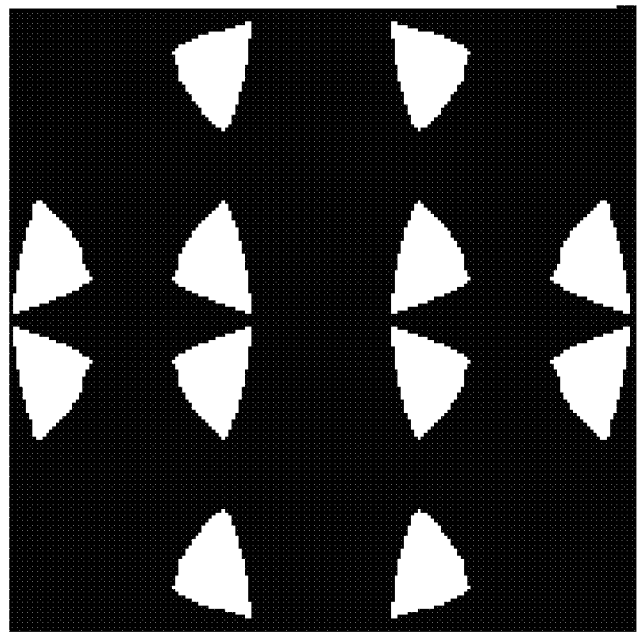
FIG. 5D is an exemplary pupil filter design for minimizing the effects of stray lights according to the second embodiment of the present disclosure.
Figure 5C:
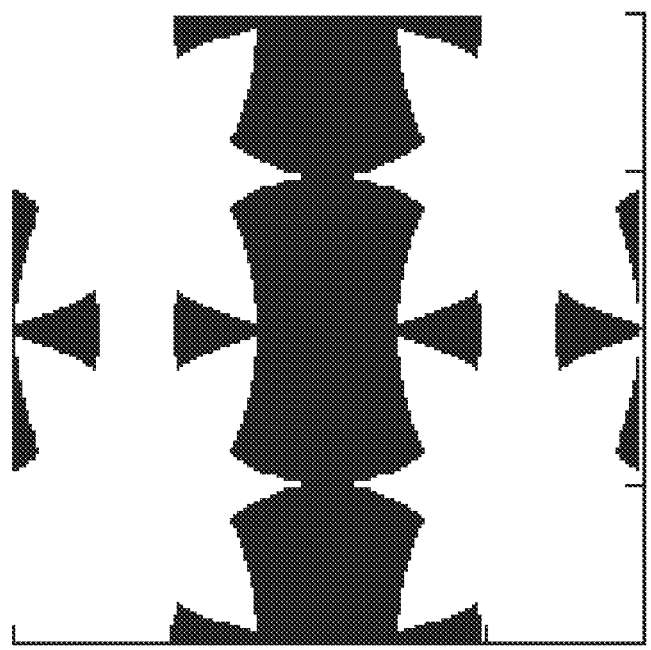
FIG. 5C is an exemplary pupil filter design for maximizing printing of other features than target features according to the second embodiment of the present disclosure.

FIG. 5C represents an example of a pupil filter design in which the portion of the background area within the numerical aperture 422 is transparent, and the portion of the background area outside the numerical aperture 422 is opaque. It is noted that the transmission of the area outside the numerical aperture 422 has no impact on the image because rays of light impinging outside the numerical aperture 422 do not reach the photoresist 52 on the substrate 50 (See FIG. 1).

Referring to step 460 of FIG. 4, if it is more desirable to reduce the effects of stray light in the lithographic exposure system than to maximize printing of features other than the target feature having the periodically repeated patterns on the reticle, the value of the background "B" is set to 0 to complete the design of the pupil filter. Thus, in the design for a pupil filter, areas including pixels that are not a +1 diffraction order pixel or a −1 diffraction order pixel for any of the selected pixels as opaque areas in the pupil filter design.

FIG. 5D represents an example of a pupil filter design in which the entirety of the background area is opaque.

In some embodiments of the present disclosure, various portions of the background area can be assigned different values of transmission.

It is noted that the transmission of the area outside the numerical aperture 422 has no impact on the image because rays of light impinging outside the numerical aperture 422 do not reach the photoresist 52 on the substrate 50 (See FIG. 1).

Figure 5E:
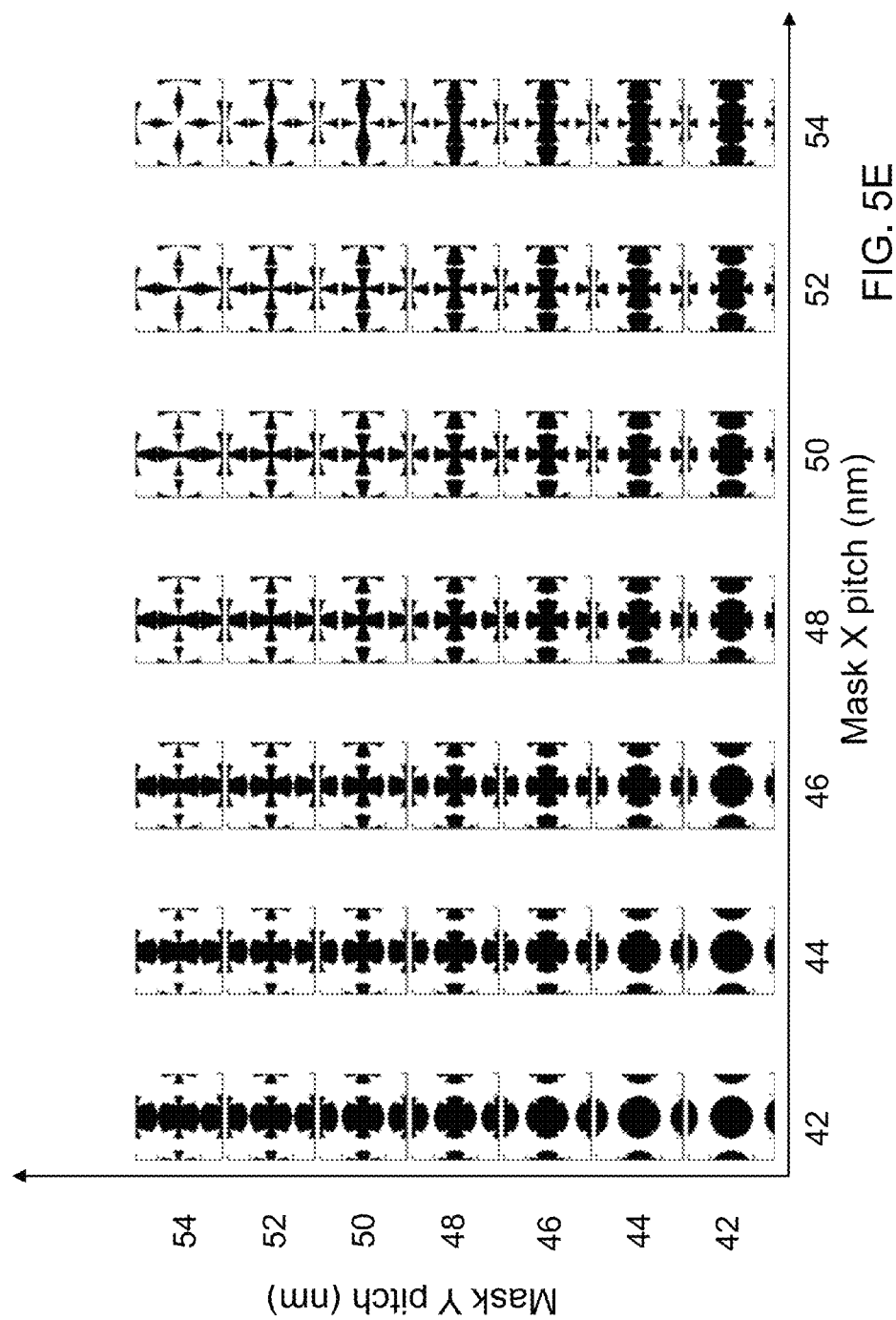
FIG. 5E is an illustration of changes in the pupil filter design for contrast enhancement as a function of the mask X-pitch and the mask Y-pitch of a lithographic mask including a dense array of contact holes according to the second embodiment of the present disclosure.

Referring to FIG. 5E, changes in the pupil filter design for contrast enhancement are illustrated as a function of the mask pitch of a one-dimensional array of lines and spaces. A "mask X pitch" refers to the pitch of the periodic features along the x-direction on a lithographic substrate divided by the image reduction factor of the lithographic exposure system. Thus, a mask X pitch is a mask pitch along the x direction. A "mask Y pitch" refers to the pitch of the periodic features along the y-direction on a lithographic substrate divided by the image reduction factor of the lithographic exposure system. Thus, a mask Y pitch is a mask pitch along the y direction. All examples illustrated are designed for a 13.5 nm wavelength EUV lithography system with a 0.25 Numerical aperture.

In one embodiment, a lithographic system can include the lithographic exposure tool of FIG. 1A. A pupil filter 40 (See FIG. 1) employing the pupil filter design provided in the flow chart of FIG. 4 can be employed in the lithographic system. Once such a lithographic system is provided, a substrate 50 with a photoresist layer 52 thereupon can be loaded into the lithographic exposure tool. The photoresist layer 52 can be subsequently lithographically exposed employing the lithographic exposure tool and the pupil filter 40 according to an embodiment of the present disclosure. Such a pupil filter 40 can enhance the contrast of printed images on the photoresist, i.e., the printed lithographic features on the photoresist layer 52 has greater contrast than a comparable printed image employing the same reticle and a pupil lens that does not include a pupil filter.

Figure 6:
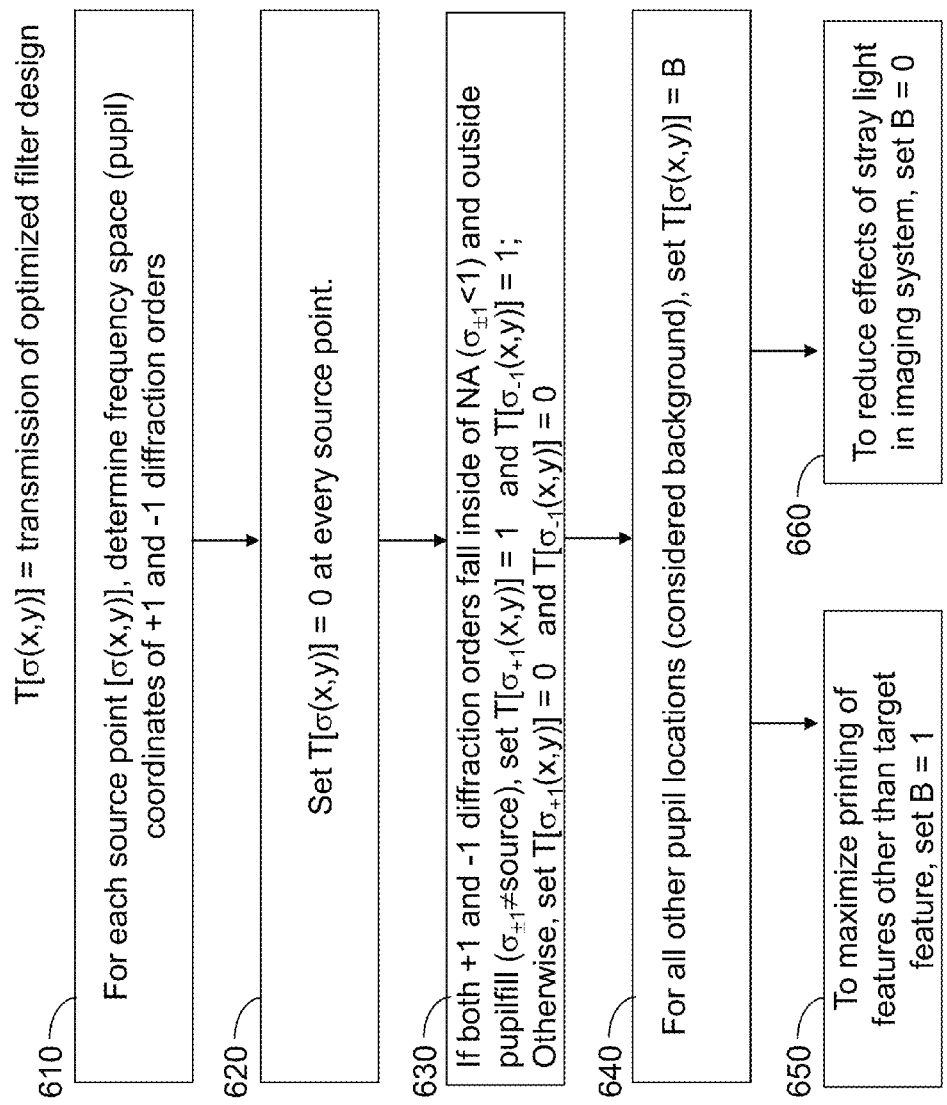
FIG. 6 is a third flow chart for generating a pupil filter design according to a third embodiment of the present disclosure.

Referring to FIG. 6, a third flow chart for generating a pupil filter design for frequency doubling is shown according to a third embodiment of the present disclosure.

Figure 7A:
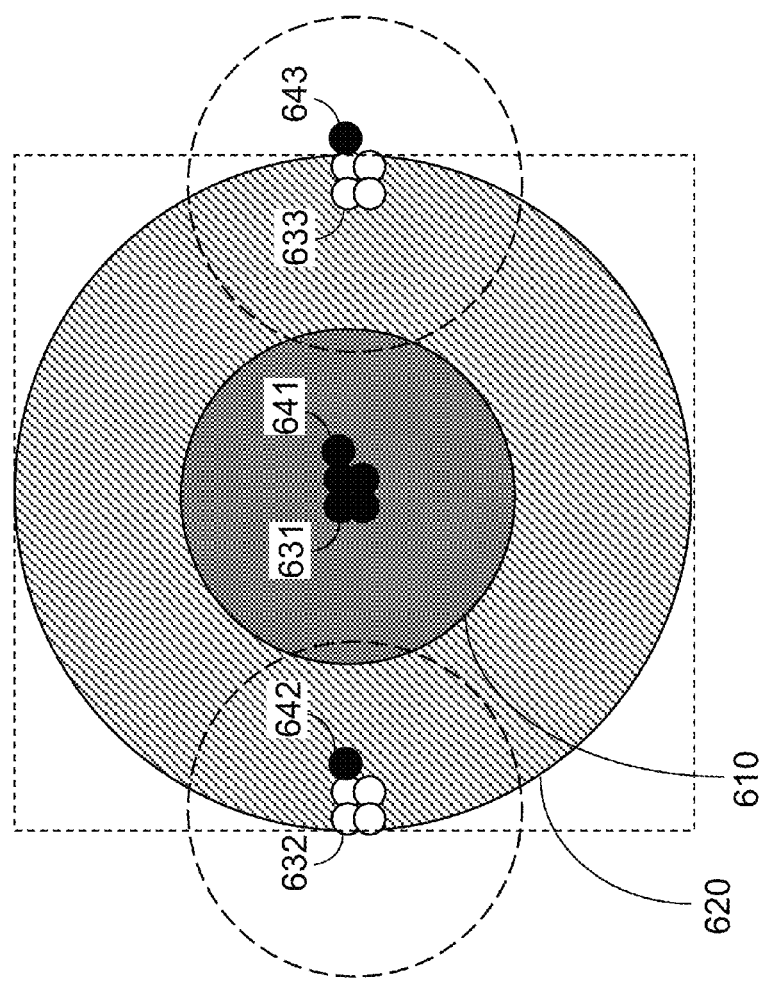
FIG. 7A is a diagram illustrating determination of whether pixels in a pupil coordinate system is classified as transparent pixels or opaque pixels for frequency doubling according to the third embodiment of the present disclosure.

FIG. 7A shows a numerical aperture 622 and the source image 612 for an exemplary case in which the illuminator 12 (See FIG. 1) has a circular opening. The dotted rectangle in FIG. 7A represents a possible shape that can be used as the outside edge of a pupil filter. Referring to step 610 of FIG. 6 and FIG. 7A, all pixels within an area of the source image 612 of a lithographic exposure tool in a pupil coordinate system are marked as opaque pixels. By marking all pixels within the area of the source image 612 as opaque pixels, all direct rays (zeroth order rays) of the illumination radiation are blocked by the pupil filter.

Referring to step 620, each pixel within the area of a source image of a lithographic exposure tool in a pupil coordinate system is selected one at a time. Each pixel in the pupil coordinate system can be represented as a pixel $\sigma(x,y)$. The entire area of the numerical aperture can be represented by a two dimensional Cartesian coordinate (x, y), in which $x^2+y^2 \leq 1$. The distance between the origin of the pupil coordinate system and a pixel $\sigma(x,y)$ can be represented as $|\sigma(x,y)|$, or $\sigma$.

The lithographic mask can include at least one pattern repetition direction, i.e., a direction along which a pattern is periodically repeated. The at least one pattern repetition direction can be a single direction, or can be two directions that are different from each other. In one embodiment, a lithographic pattern in the reticle 30 (See FIG. 1) can include a one-dimensional array of periodic patterns having a periodicity in one direction. In one embodiment, the at least one pattern repetition direction consists of a single direction, and the periodic pattern is a one-dimensional array of repetitions of a line and a space.

For each selected pixel from within the source image, and for each of at least one pattern repetition direction in the lithographic mask, locations of a set of a +1 diffraction order pixel and a −1 diffraction order pixel corresponding to the pitch of the periodic pattern in the lithographic mask are determined. If the lithographic pattern includes a single pattern repetition direction, locations of a single set of a +1 diffraction order pixel and a −1 diffraction order pixel corresponding to the pitch of the periodic pattern in the lithographic mask are determined for the selected pixel. In this embodiment, a "+1 diffraction order pixel" is the pixel laterally spaced from the selected pixel by a shift of $\lambda/(pitch \cdot NA)$ along a direction of a pattern repetition direction, in which $\lambda$ is the wavelength of the electromagnetic radiation emitted from the illumination source 10 (See FIG. 1), and "pitch" refers to the pitch of the periodic pattern along the pattern repetition direction. The coordinate of a +1 diffraction order pixel for a selected pixel $\sigma(x,y)$ is herein represented as $\sigma_{+1}(x,y)$. In this embodiment, a "−1 diffraction order pixel" is the pixel laterally spaced from the selected pixel by a shift of $\lambda/(pitch \cdot NA)$ in the opposite direction of the shift of the +1 diffraction order pixel relative to the selected pixel. The coordinate of a −1 diffraction order pixel for a selected pixel $\sigma(x,y)$ is herein represented as $\sigma_{-1}(x,y)$. The coordinates of a +1 diffraction order pixel and a −1 diffraction order pixel are collectively represented as $\sigma_{\pm 1}(x,y)$.

In an illustrative example, the direction of periodicity of the one-dimensional array of periodic patterns can correspond to the X-direction (horizontal direction) in FIG. 7A. For each selected pixel within the area of the source image 612 of the lithographic exposure tool in the pupil coordinate system, the coordinates of a +1 diffraction order pixel and a −1 diffraction order pixel, as represented by pixels in the pupil coordinate system, can be determined. For example, the one-dimensional array of periodic patterns can be a periodic pattern of a line and a space with a pitch.

Referring to step 630 of FIG. 6, all pixels within the at least one set of the +1 diffraction order pixel and the −1 diffraction order pixel and within the numerical aperture in the pupil coordinate system are marked as transparent pixels if, for each of the at least one pattern repetition direction, all of a corresponding +1 diffraction order pixel and a corresponding −1 diffraction order pixel are within the numerical aperture 622 but outside of the source image. If there is only one pattern repetition direction, there is only one set of the +1 diffraction order pixel and the −1 diffraction order pixel. In this case, all pixels within the set of the +1 diffraction order pixel and the −1 diffraction order pixel and within the numerical aperture 622 in the pupil coordinate system are marked as transparent pixels if, for the pattern repetition direction, both of the corresponding +1 diffraction order pixel and the corresponding −1 diffraction order pixel are within the numerical aperture 622 but outside of the source image. For example, for each selected pixel 631 for which both of a +1 diffraction order pixel 632 and a −1 diffraction order pixel 633 are located within the numerical aperture 622 but outside of the source image, the corresponding +1 diffraction order pixel 632 and the corresponding −1 diffraction order pixel 633 to the selected pixel 631 are within the numerical aperture 622 and thus are marked as transparent pixels. The selected pixel 631 remains opaque since it falls within the source image.

As used herein, the location of a pixel is determined by the center point of the pixel. For example, a pixel is considered to be located outside the numerical aperture if the center point of the pixel is located outside the numerical aperture. While the pixels illustrated in the drawings of the instant application are circular, the shape of the pixels can be rectangular, hexagonal, or of any other shape as known in the art.

In one embodiment, the transmission T of the optimized filter design can be a function of the coordinates in the pupil coordinate system. In this case, the transmission of the pupil filter design is set to 1 at the +1 diffraction order pixel (i.e., $T[\sigma_{+1}(x,y)]=1$), and the transmission of the pupil filter design is set to 1 at the −1 diffraction order pixel (i.e., $T[\sigma_{-1}(x,y)]=1$). This step can be performed employing one or more processing units of the computing means. It is noted that the transmission of the pupil filter design is set to 0 at the selected source pixel (i.e., $T[\sigma(x,y)]=1$) at the prior step 610.

Further, all pixels within the at least one set and within the numerical aperture 622 in the pupil coordinate system are marked as opaque pixels if, for any of the at least one pattern repetition direction, at least one of a corresponding +1 diffraction order pixel and a corresponding −1 diffraction order pixel is not within the numerical aperture 622. If there is only one pattern repetition direction, there is only one set of the +1 diffraction order pixel and the −1 diffraction order pixel. In this case, the selected pixel and each of the corresponding +1 diffraction order pixel and the corresponding −1 diffraction order pixel that are present within the numerical aperture 622 is marked as opaque pixels if, for any of the at least one pattern repetition direction, at least one of a corresponding +1 diffraction order pixel and a corresponding −1 diffraction order pixel is outside of the numerical aperture 622. For example, for each selected pixel 641 for which at least one of a +1 diffraction order pixel 632 and a −1 diffraction order pixel 633 is located outside the numerical aperture 622, the selected pixel 241 and each of the corresponding +1 diffraction order pixel 642 and the corresponding −1 diffraction order pixel 643 that are present within the numerical aperture 622 are marked as opaque pixels. In the illustrated example of FIG. 7A, the −1 diffraction order pixel 643 is located outside the numerical aperture 622. Thus, the selected point 641 and the +1 diffraction order pixel 642 are marked as opaque pixels.

In other words, for each selected pixel 641 for which at least one of a +1 diffraction order pixel 632 and a −1 diffraction order pixel 633 is located outside the numerical aperture 622, the transmission of a pupil filter design is set to 0 at each of the corresponding +1 diffraction order pixel 642 and the corresponding −1 diffraction order pixel 643 that are present within the numerical aperture 622 (i.e., $T[\sigma_{\pm}(x,y)]=0$ for each $\sigma_{\pm}(x,y)$ located within the numerical aperture 622). This step can be performed employing one or more processing units of the computing means.

Referring to step 640 of FIG. 6, all other pixels within the pupil coordinate system are marked (designated) as background pixels, and are assigned a value of "B." In other words, for all pixels $\sigma(x,y)$ within the numerical aperture 622 that are not within the source image 612, not one of the +1 diffraction order pixels, and not one of the −1 diffraction order pixels, the transmission of that pixel is set to "B" (i.e., $T[\sigma(x,y)]=B$).

Figure 7B:
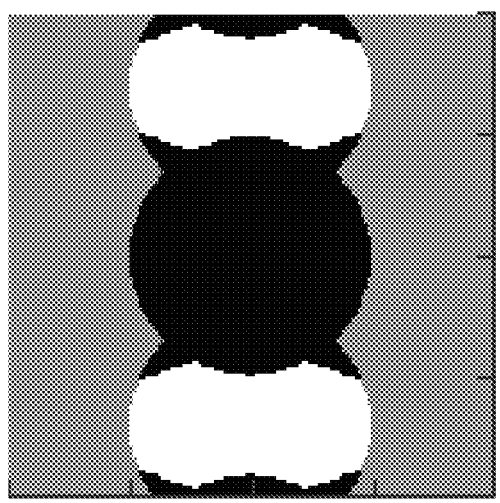
FIG. 7B is an exemplary pupil filter design according to third embodiment of the present disclosure.

A pupil filter design is generated such that all areas corresponding to the transparent pixels are transparent, and all areas corresponding to the opaque pixels are opaque. An exemplary pupil filter design generated by this method is shown in FIG. 7B, in which the dark area represents an opaque area, the white areas represent transparent areas, and the grey area represents the area marked as a background area having "B" as the value of the transmission.

Referring to step 650 of FIG. 6, if it is more desirable to maximize printing of features other than the target feature having the periodically repeated patterns on the reticle than to reduce the effects of stray light in the lithographic exposure system, the value of the background "B" is set to 1 to complete the design of the pupil filter. Thus, in the design for a pupil filter, the areas including pixels that are not a +1 diffraction order pixel or a −1 diffraction order pixel for any of the selected pixels are set as transparent areas in the pupil filter design.

Figure 7D:
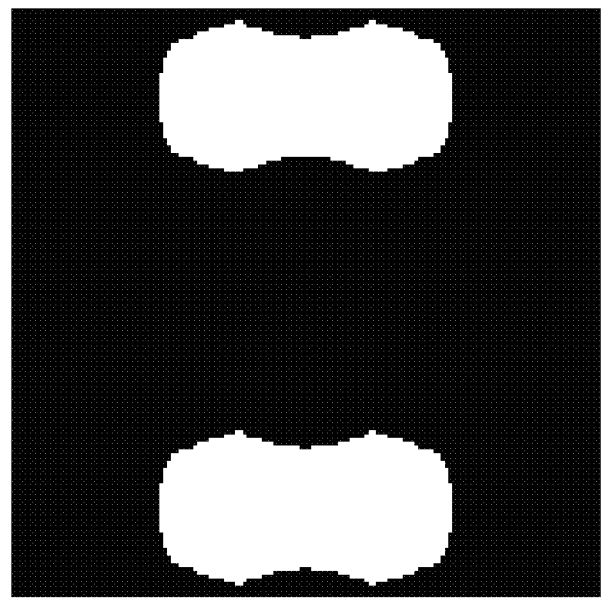
FIG. 7D is an exemplary pupil filter design for minimizing the effects of stray lights according to the third embodiment of the present disclosure.
Figure 7C:
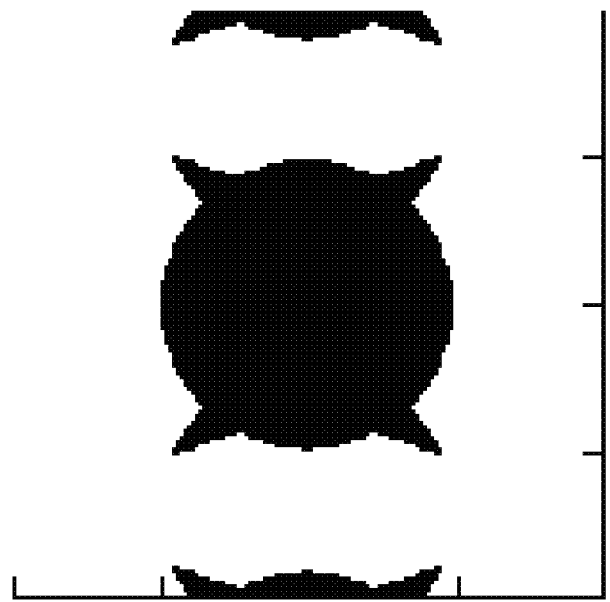
FIG. 7C is an exemplary pupil filter design for maximizing printing of other features than target features according to the third embodiment of the present disclosure.

FIG. 7C represents an example of a pupil filter design in which the portion of the background area within the numerical aperture 622 is transparent, and the portion of the background area outside the numerical aperture 622 is opaque. It is noted that the transmission of the area outside the numerical aperture 622 has no impact on the image because rays of light impinging outside the numerical aperture 622 do not reach the photoresist 52 on the substrate 50 (See FIG. 1).

Referring to step 660 of FIG. 6, if it is more desirable to reduce the effects of stray light in the lithographic exposure system than to maximize printing of features other than the target feature having the periodically repeated patterns on the reticle, the value of the background "B" is set to 0 to complete the design of the pupil filter. Thus, in the design for a pupil filter, areas including pixels that are not a +1 diffraction order pixel or a −1 diffraction order pixel for any of the selected pixels as opaque areas in the pupil filter design.

FIG. 7D represents an example of a pupil filter design in which the entirety of the background area is opaque.

In some embodiments of the present disclosure, various portions of the background area can be assigned different values of transmission.

It is noted that the transmission of the area outside the numerical aperture 622 has no impact on the image because rays of light impinging outside the numerical aperture 622 do not reach the photoresist 52 on the substrate 50 (See FIG. 1).

Figure 7E:
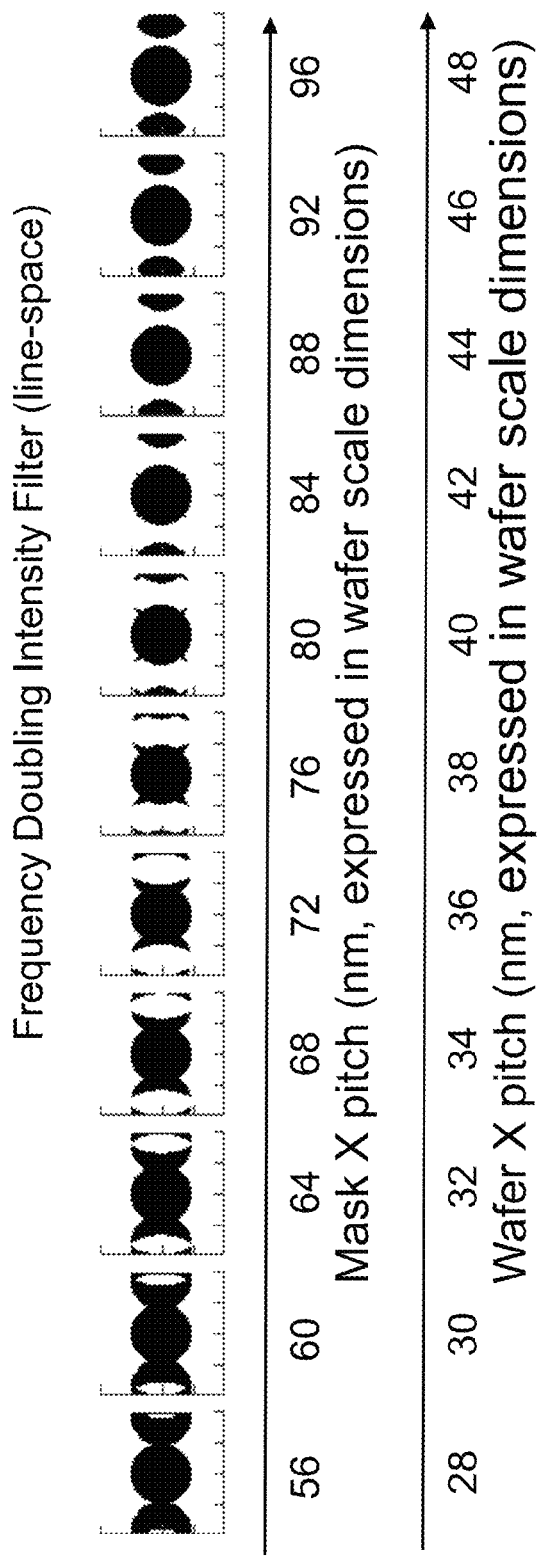
FIG. 7E is an illustration of changes in the pupil filter design for frequency doubling as a function of the mask X-pitch according to the third embodiment of the present disclosure.

Referring to FIG. 7E, changes in the pupil filter design for contrast enhancement are illustrated as a function of the mask pitch of a one-dimensional array of lines and spaces. In one embodiment, a lithographic system can include the lithographic exposure tool of FIG. 1A. A pupil filter 40 (See FIG. 1) employing the pupil filter design provided in the flow chart of FIG. 6 can be employed in the lithographic system. Once such a lithographic system is provided, a substrate 50 with a photoresist layer 52 thereupon can be loaded into the lithographic exposure tool. The photoresist layer 52 can be subsequently lithographically exposed employing the lithographic exposure tool and the pupil filter 40 according to an embodiment of the present disclosure. Such a pupil filter 40 can provide frequency doubling of printed images on the photoresist along the x direction, i.e., the printed lithographic features on the photoresist layer 52 has a pitch that is one half of the mask pitch. All examples illustrated are designed for a 13.5 nm wavelength EUV lithography system with a 0.25 Numerical aperture.

Figure 8:
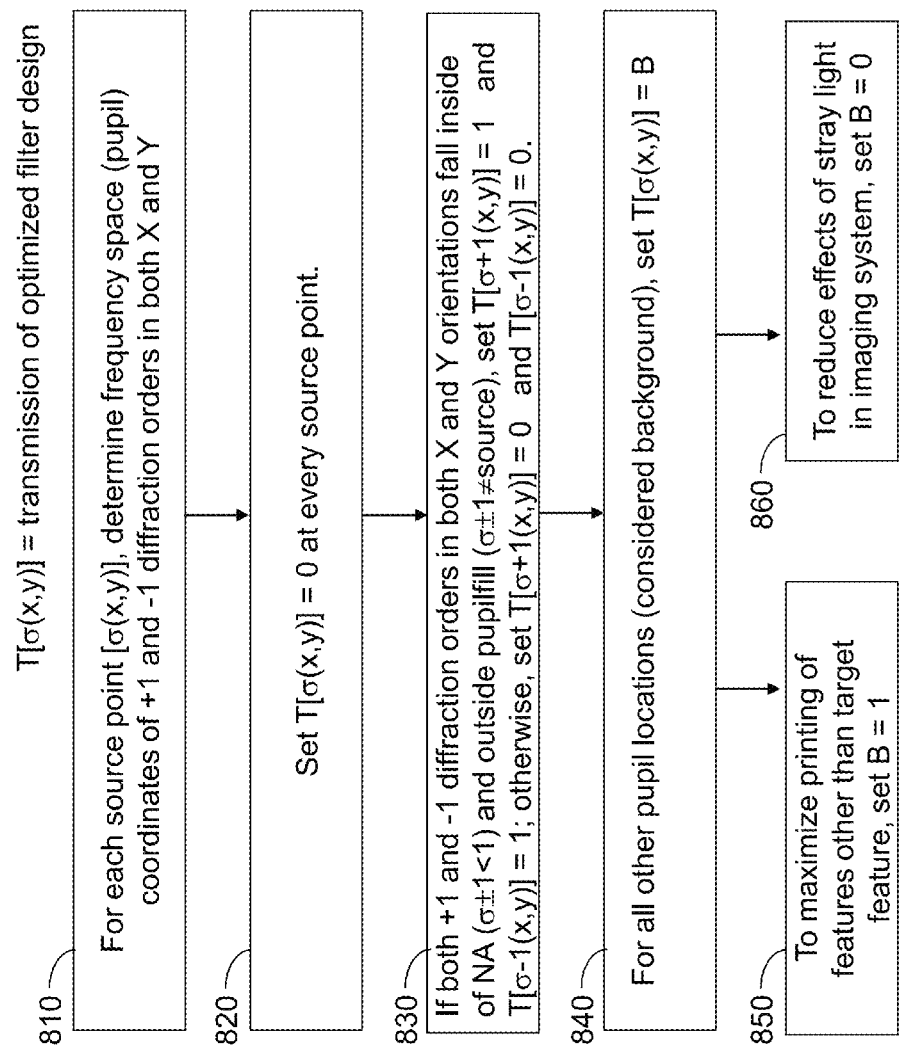
FIG. 8 is a fourth flow chart for generating a pupil filter design according to a fourth embodiment of the present disclosure.

Referring to FIG. 8, a fourth flow chart for generating a pupil filter design for frequency doubling is shown according to a fourth embodiment of the present disclosure. FIG. 9A shows a numerical aperture 822 and the source image 812 for an exemplary case in which the illuminator 12 (See FIG. 1) has a circular opening. The dotted rectangle in FIG. 9A represents a possible shape that can be used as the outside edge of a pupil filter. Referring to step 810 of FIG. 8 and FIG. 9A, all pixels within an area of the source image 812 of a lithographic exposure tool in a pupil coordinate system are marked as opaque pixels. By marking all pixels within the area of the source image 812 as opaque pixels, all direct rays (zeroth order rays) of the illumination radiation are blocked by the pupil filter.

Referring to step 820, each pixel within the area of a source image of a lithographic exposure tool in a pupil coordinate system is selected one at a time. Each pixel in the pupil coordinate system can be represented as a pixel $\sigma(x,y)$. The entire area of the numerical aperture can be represented by a two dimensional Cartesian coordinate $(x, y)$, in which $x^2+y^2 \leq 1$. The distance between the origin of the pupil coordinate system and a pixel $\sigma(x,y)$ can be represented as $|\sigma(x,y)|$, or $\sigma$.

The lithographic mask can include at least one pattern repetition direction, i.e., a direction along which a pattern is periodically repeated. The at least one pattern repetition direction can be a single direction, or can be two directions that are different from each other. In one embodiment, a lithographic pattern in the reticle 30 (See FIG. 1) can include a two-dimensional array of periodic patterns having a periodicity in two directions. In one embodiment, the at least one pattern repetition direction includes two directions, and the periodic pattern is a two-dimensional array of contact holes.

For each selected pixel from within the source image, and for each of at least one pattern repetition direction in the lithographic mask, locations of a set of a +1 diffraction order pixel and a −1 diffraction order pixel corresponding to the pitch of the periodic pattern in the lithographic mask are determined. If the lithographic pattern includes two pattern repetition directions, locations of two sets of a +1 diffraction order pixel and a −1 diffraction order pixel corresponding to each pitch of the periodic pattern in the lithographic mask are determined for the selected pixel. In this embodiment, a "+1 diffraction order pixel" is the pixel laterally spaced from the selected pixel by a shift of $\lambda/(X\text{pitch}\cdot NA)$ along the x direction (one of the two pattern repetition directions) or the pixel laterally spaced from the selected pixel by a shift of $\lambda/(Y\text{pitch}\cdot NA)$ along the y direction (another of the two pattern repetition directions). $\lambda$ is the wavelength of the electromagnetic radiation emitted from the illumination source 10 (See FIG. 1), "Xpitch" refers to the pitch of the periodic pattern along the x direction, and "Ypitch" refers to the pitch of the periodic pattern along the y direction. The coordinate of each +1 diffraction order pixel for a selected pixel $\sigma(x,y)$ is herein represented as $\sigma_{+1}(x,y)$. In this embodiment, a "−1 diffraction order pixel" is the pixel laterally spaced from the selected pixel by a shift of $\lambda/(X\text{pitch}\cdot NA)$ in the opposite direction of the shift of the +1 diffraction order pixel that is shifted by $\lambda/(X\text{pitch}\cdot NA)$ along the x direction relative to the selected pixel, or the pixel laterally spaced from the selected pixel by a shift of $\lambda/(Y\text{pitch}\cdot NA)$ in the opposite direction of the shift of the +1 diffraction order pixel that is shifted by $\lambda/(Y\text{pitch}\cdot NA)$ along the y direction relative to the selected pixel. The coordinate of each −1 diffraction order pixel for a selected pixel $\sigma(x,y)$ is herein represented as $\sigma_{-1}(x,y)$. The coordinates of a +1 diffraction order pixel and a −1 diffraction order pixel are collectively represented as $\sigma_{\pm 1}(x,y)$.

For each selected pixel within the area of the source image 412 of the lithographic exposure tool in the pupil coordinate system, the coordinates of +1 diffraction order pixels and −1 diffraction order pixels, as represented by pixels in the pupil coordinate system, can be determined. For example, the two-dimensional array of periodic patterns can be a periodic pattern of contact holes having a periodicity of "Xpitch" along the x direction and having a periodicity of "Ypitch" along the y direction in FIG. 9A.

Referring to step 830 of FIG. 4, all pixels within both sets of the +1 diffraction order pixel and the −1 diffraction order pixel and within the numerical aperture in the pupil coordinate system are marked as transparent pixels if, for both pattern repetition directions, all of a corresponding +1 diffraction order pixel and a corresponding −1 diffraction order pixel are within the numerical aperture 820 but outside the source image (pupilfill). If there are two pattern repetition directions, there exist two sets of a +1 diffraction order pixel and a −1 diffraction order pixel. In this case, all pixels within the two sets of the +1 diffraction order pixel and the −1 diffraction order pixel and within the numerical aperture 422 in the pupil coordinate system are marked as transparent pixels if, for both pattern repetition directions, both of the corresponding +1 diffraction order pixel and the corresponding −1 diffraction order pixel are within the numerical aperture 822 but outside the source image (pupilfill). For example, for each selected pixel 831 for which both of a +1 diffraction order pixel 832 and a −1 diffraction order pixel 833 along the x direction are located within the numerical aperture 820 and for which both of a +1 diffraction order pixel 834 and a −1 diffraction order pixel 835 are located within the numerical aperture 820, corresponding +1 diffraction order pixels (832, 834) and the corresponding −1 diffraction order pixels (833, 835) to the selected pixel 831 are within the numerical aperture 822 but outside of the source image, and thus are marked as transparent pixels. It is noted that the selected pixel 831 remains opaque since it falls within the source image.

In one embodiment, the transmission T of the optimized filter design can be a function of the coordinates in the pupil coordinate system. In this case, the transmission of the pupil filter design is set to 1 at each +1 diffraction order pixel (i.e., $T[\sigma_{+1}(x,y)]=1$), and the transmission of the pupil filter design is set to 1 at each −1 diffraction order pixel (i.e., $T[\sigma_{-1}(x,y)]=1$). This step can be performed employing one or more processing units of the computing means. It is noted that the transmission of the pupil filter design is set to 1 at the selected source pixel (i.e., $T[\sigma(x,y)]=1$) at the prior step 810.

Further, all pixels within the at least one set and within the numerical aperture 820 in the pupil coordinate system are marked as opaque pixels if, for any of the at least one pattern repetition direction, at least one of a corresponding +1 diffraction order pixel and a corresponding −1 diffraction order pixel is outside the numerical aperture 820. If there are two pattern repetition directions, there exist two sets of a +1 diffraction order pixel and a −1 diffraction order pixel for the selected pixel. In this case, all pixels within the two sets and within the numerical aperture 422 in the pupil coordinate system are marked as opaque pixels if, for any of the at least one pattern repetition direction, at least one of a corresponding +1 diffraction order pixel and a corresponding −1 diffraction order pixel is outside of the numerical aperture 822 or within the source image. For example, for each selected pixel 841 for which at least one of a +1 diffraction order pixel 842 and a −1 diffraction order pixel 843 in a first set of diffraction order pixels is located outside the numerical aperture 820 or for which at least one of a +1 diffraction order pixel 834 and a −1 diffraction order pixel 835 in a second set of diffraction order pixels is located outside the numerical aperture 820, each of the corresponding +1 diffraction order pixel (842, 844) and each of the corresponding −1 diffraction order pixel (843, 845) within the numerical aperture 820 are marked as opaque pixels. In the illustrated example of FIG. 8, a +1 diffraction order pixel 843 in the first set of diffraction order pixels is located outside the numerical aperture 820. Thus, the +1 diffraction order pixel 845 and the −1 diffraction order pixels (842, 844) located within the numerical aperture 822 are marked as opaque points.

In other words, for each selected pixel 841 for which at least one of a +1 diffraction order pixel 843 and a −1 diffraction order pixel 842 in a first set of diffraction order pixels is located outside the numerical aperture 820 or for which at least one of a +1 diffraction order pixel 845 and a −1 diffraction order pixel 844 in a second set of diffraction order pixels is located outside the numerical aperture 820, the transmission of the pupil filter design is set to 0 at each +1 diffraction order pixel (i.e., $T[\sigma_{+1}(x,y)]=0$) if the +1 diffraction order pixel is within the numerical aperture 820, and the transmission of the pupil filter design is set to 0 at each −1 diffraction order pixel (i.e., $T[\sigma_{-1}(x,y)]=0$) if the −1 diffraction order pixel is within the numerical aperture 820. This step can be performed employing one or more processing units of the computing means.

Referring to step 840 of FIG. 8, all other pixels within the pupil coordinate system are marked (designated) as background pixels, and are assigned a value of "B." In other words, for all pixels $\sigma(x,y)$ that are not within the source image 812, not one of the +1 diffraction order pixels, and not one of the −1 diffraction order pixels, the transmission of that pixel is set to "B" (i.e., $T[\sigma(x,y)]=B$). A pupil filter design is generated such that all areas corresponding to the transparent pixels are transparent, and all areas corresponding to the opaque pixels are opaque.

Referring to step 850 of FIG. 8, if it is more desirable to maximize printing of features other than the target feature having the periodically repeated patterns on the reticle than to reduce the effects of stray light in the lithographic exposure system, the value of the background "B" is set to 1 to complete the design of the pupil filter. Thus, in the design for a pupil filter, the areas including pixels that are not a +1 diffraction order pixel or a −1 diffraction order pixel for any of the selected pixels are set as transparent areas in the pupil filter design.

Referring to step 860 of FIG. 8, if it is more desirable to reduce the effects of stray light in the lithographic exposure system than to maximize printing of features other than the target feature having the periodically repeated patterns on the reticle, the value of the background "B" is set to 0 to complete the design of the pupil filter. Thus, in the design for a pupil filter, areas including pixels that are not a +1 diffraction order pixel or a −1 diffraction order pixel for any of the selected pixels as opaque areas in the pupil filter design.

Figure 9B:
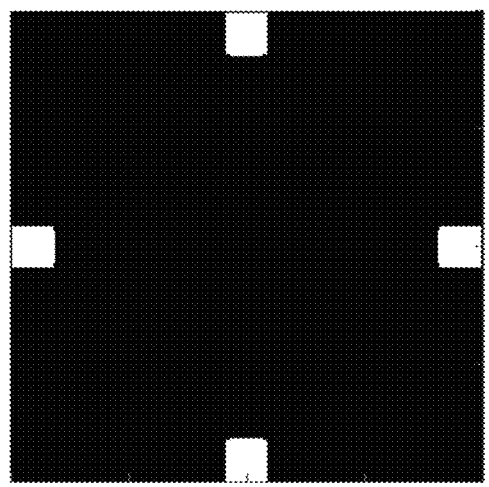
FIG. 9B is an exemplary pupil filter design according to fourth embodiment of the present disclosure.

In some embodiments, depending on the size and shape of the source image 812, the mask X pitch, and the mask Y pitch, all of the pixels in the numerical aperture 822 can be within the source image 812, or one of the +1 diffraction order pixels and the −1 diffraction order pixels. In this case, a pupil filter design may not include any area having an assigned value of "B" as illustrated in FIG. 9B. In FIG. 9B, the dark area represents an opaque area, and the white areas represent transparent areas.

It is noted that the transmission of the area outside the numerical aperture 820 has no impact on the image because rays of light impinging outside the numerical aperture 820 do not reach the photoresist 52 on the substrate 50 (See FIG. 1).

Figure 9C:
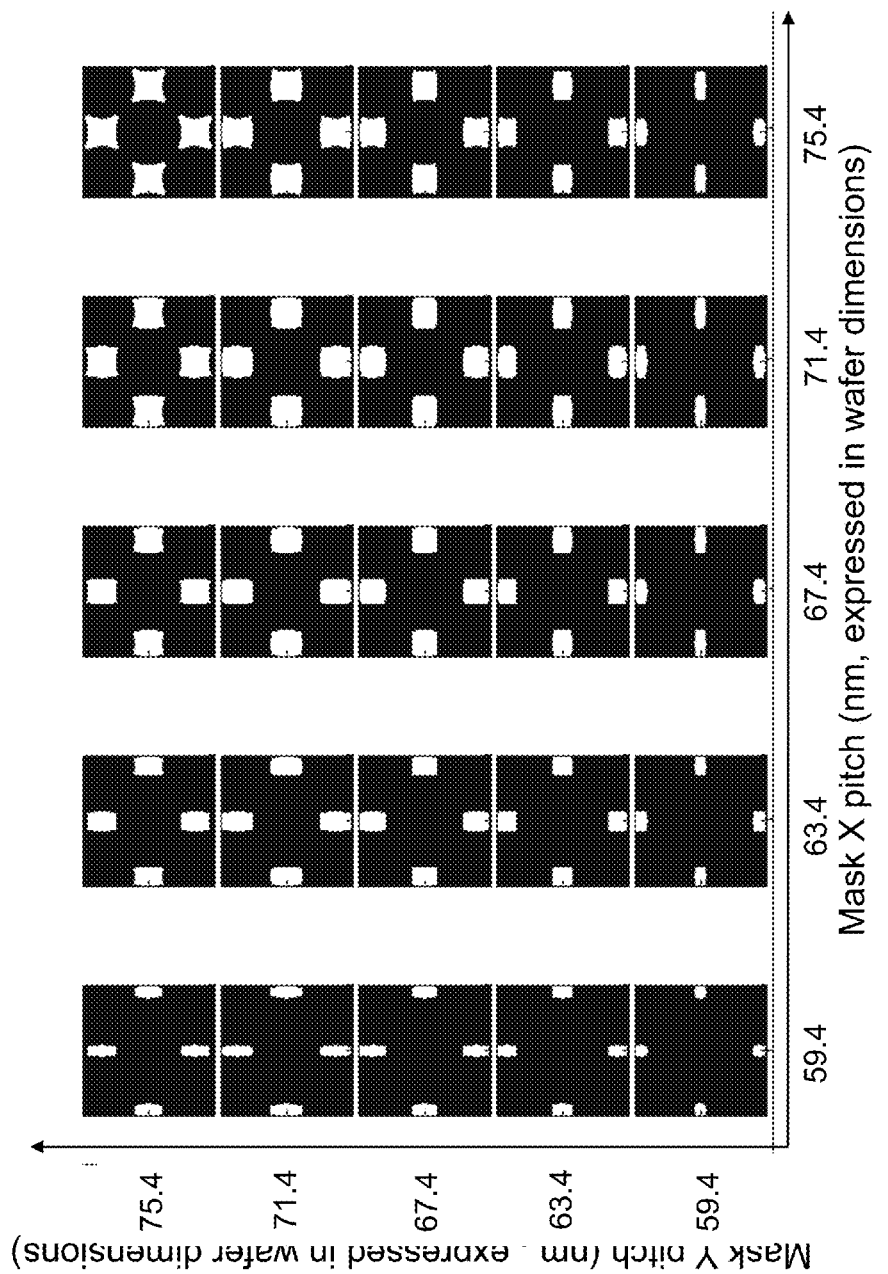
FIG. 9C is an illustration of changes in the pupil filter design for frequency doubling as a function of the mask X-pitch according to the fourth embodiment of the present disclosure.

Referring to FIG. 9C, changes in the pupil filter design for frequency doubling are illustrated as a function of the mask pitch of a one-dimensional array of lines and spaces. A "mask X pitch" refers to the pitch of the periodic features along the x-direction on a lithographic substrate divided by the image reduction factor of the lithographic exposure system. Thus, a mask X pitch is a mask pitch along the x direction. A "mask Y pitch" refers to the pitch of the periodic features along the y-direction on a lithographic substrate divided by the image reduction factor of the lithographic exposure system. Thus, a mask Y pitch is a mask pitch along the y direction. For this embodiment that employs frequency doubling, the wafer pitch in X and Y will be that of the mask pitch multiplied by the square root of 2 (i.e. a square contact array with mask pitch of 59.4 nm will produce a staggered wafer contact array with pitch of roughly 40 nm).

In one embodiment, a lithographic system can include the lithographic exposure tool of FIG. 1A. A pupil filter 40 (See FIG. 1) employing the pupil filter design provided in the flow chart of FIG. 8 can be employed in the lithographic system. Once such a lithographic system is provided, a substrate 50 with a photoresist layer 52 thereupon can be loaded into the lithographic exposure tool. The photoresist layer 52 can be subsequently lithographically exposed employing the lithographic exposure tool and the pupil filter 40 according to an embodiment of the present disclosure. Such a pupil filter 40 can provide frequency doubling of printed images on the photoresist along the x direction and long the y direction, i.e., the printed lithographic features on the photoresist layer 52 has a pitch along the x direction that is that of the mask pitch in X multiplied by the square root of 2 and a pitch along the y direction that is that of the mask pitch in Y multiplied by the square root of 2.

In some cases, the transparent areas of a pupil filter can be so small that the exposure time in a lithographic exposure tool can be impracticably long. In this case, the transparent areas of the pupil filter (i.e., the openings in the opaque material layer 44 in FIG. 1) can be expanded around the original area of the transparent areas. The process of expanding the transparent areas of a pupil filter is illustrated in FIG. 9D. In one embodiment of the present disclosure, the transparent areas of a pupil filter design can be expanded to provide increase the area through which illuminating radiation can pass in order to provide a shorter exposure time for a photoresist layer.

Figure 10:
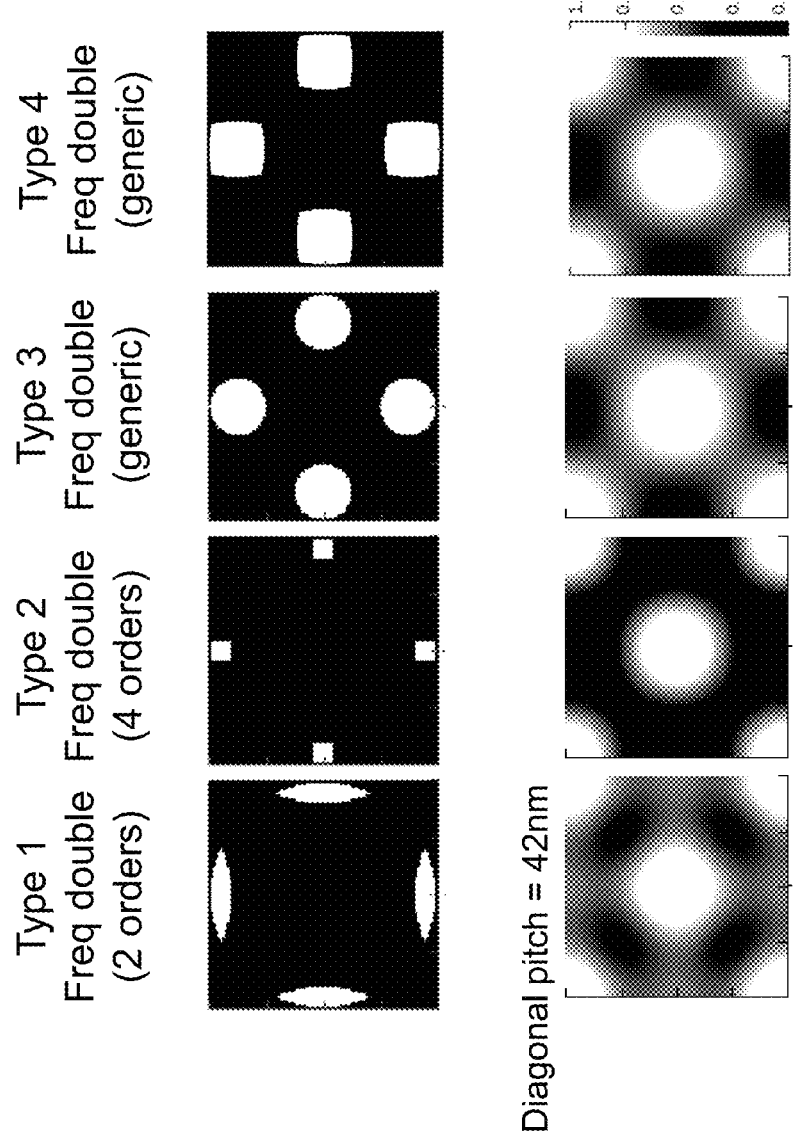
FIG. 10 illustrates four exemplary pupil filter designs and grayscale images of the areal image intensity for each of the four exemplary pupil filter designs according to the fourth embodiment of the present disclosure.

It is understood that such an expansion of the transparent areas of a pupil filter adversely affects the contrast in printed images. FIG. 10 compares four pupil filters and the image contrast in the corresponding printed images in a simulation of lithographic images. Type 1 frequency doubling pupil filter is designed by adding two sets of transparent areas. Each set of transparent areas is derived by the method of the third embodiment. A first set of transparent areas (white areas along the x-axis) provides frequency doubling along the x direction, and a second set of transparent areas (white areas along the y-axis) provides frequency doubling along the y direction. Type 2 frequency doubling pupil filter is designed according to the method of the fourth embodiment. Type 3 and Type 4 frequency doubling pupil filters are designed by expanding the transparent areas of the type 2 frequency doubling filter using the shape of circular openings (type 3) or using the shape of substantially square openings (type 4). The wavelength of the illumination radiation is 13.5 nm, the numerical aperture is 0.25, and diagonal pitch of the printed image is 42 nm in this simulation.

Figure 11A:
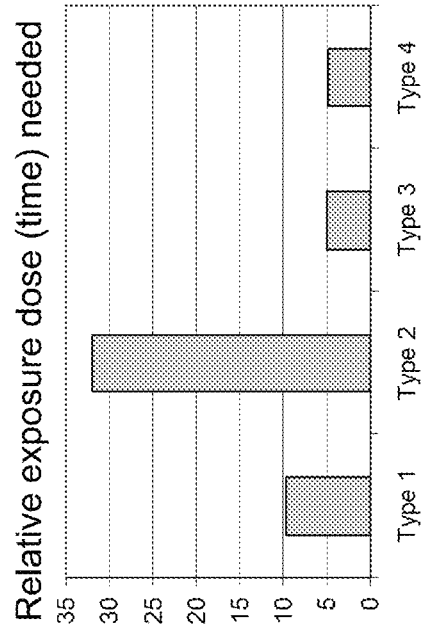
FIG. 11A is a graph illustrating the relative exposure dose needed to print lithographic patterns employing the four exemplary pupil filter designs of FIG. 10.

FIG. 11A illustrates the relative exposure dose needed to print lithographic patterns employing the four types of frequency doubling pupil filters of FIG. 10. It can be seen that the type 2 frequency doubling pupil filter requires the longest exposure time.

Figure 11B:
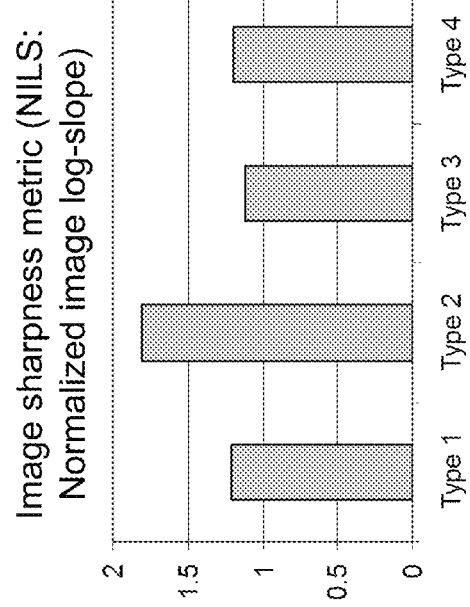
FIG. 11B is a graph illustrating an image sharpness metric for the four exemplary pupil filter designs of FIG. 10.

FIG. 11B is a graph illustrating an image sharpness metric for the four types of frequency doubling pupil filters of FIG. 10. The image sharpness metric employed herein is normalized image log-slope, a commonly used metric in the art, and is defined as the slope of the Intensity vs. position, multiplied by the half-pitch and divided by the Intensity. Alternately, this can be expressed as the derivative of the natural log of the Intensity with respect to position multiplied by the half-pitch. It can be seen that the type 2 frequency doubling pupil filter provides the greatest image sharpness among the four types of frequency doubling pupil filters.

Figure 12A:
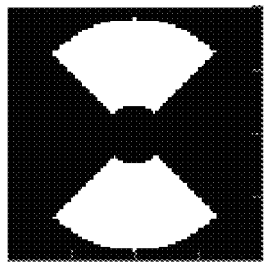
FIG. 12A is a shape of a first non-circular illumination source according to an embodiment of the present disclosure.
Figure 12B:
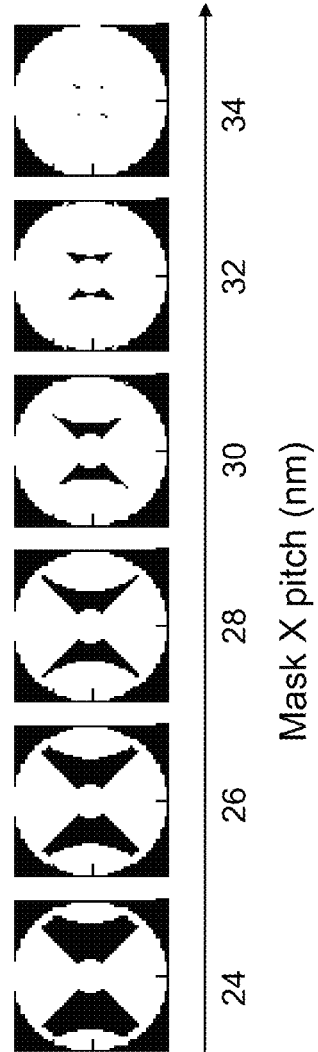
FIG. 12B is an illustration of changes in the pupil filter design for frequency doubling as a function of the mask X-pitch for a system employing the first non-circular illumination source of FIG. 12A according to an embodiment of the present disclosure.

While the various embodiments of the present disclosure has been described employing a circular shape for the source image, the various embodiments of the present disclosure can be employed for any shape of source images, i.e., for circular source images and non-circular source images. Referring to FIG. 12A, a dipole illuminator having a non-circular source shape (the shape of the white areas) is shown. The designs for a pupil filter for such a dipole illuminator corresponding to the pupil filter of the first embodiment as illustrated in FIG. 3E are shown in FIG. 12B as a function of the mask pitch.

Referring to FIG. 13A, a quadrupole illuminator having a non-circular source shape is shown. The designs for a pupil filter for such a quadrupole illuminator corresponding to the pupil filter of the first embodiment as illustrated in FIG. 5E are shown in FIG. 13B as a function of the mask X pitch and the mask Y pitch.

Figure 14:
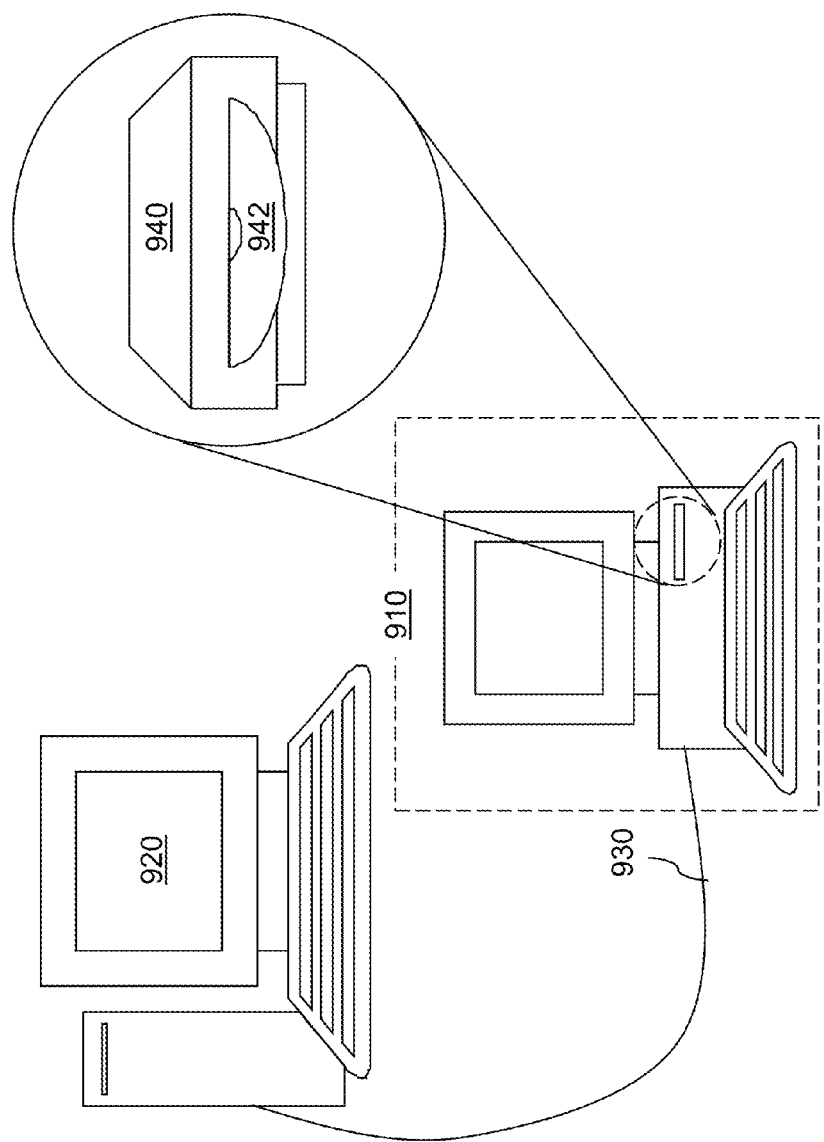
FIG. 14 is an exemplary system for generating a design for a pupil filter for use with a lithographic mask according to an embodiment of the present disclosure.

Referring to FIG. 14, an exemplary system for generating a design for a pupil filter for use with a lithographic mask is shown. The system can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910. The database can store information on reticle shapes, illuminator shapes, and various parameters of a lithographic illumination system.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 1.

The design for the pupil filter may be modified employing the various embodiments of the present disclosure. The final version of the pupil filter design can be transferred to a manufacturing facility that can manufacture a physical pupil filter. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A lithographic system comprising a lithographic exposure tool, said lithographic exposure tool comprising a pupil lens including a pupil filter for use with a lithographic mask, the pupil filter having a design generated by:

selecting, employing one or more processor units, each pixel within an area of a source image of said lithographic exposure tool in a pupil coordinate system, one at a time; and for each selected pixel within said area of said source image, determining, employing said one or more processor units, and for each of at least one pattern repetition direction in said lithographic mask, locations of a set of a +1 diffraction order pixel and a −1 diffraction order pixel corresponding to a pitch of a periodic pattern in said lithographic mask;

marking, employing said one or more processor units, all pixels within said at least one set and within a numerical aperture in said pupil coordinate system as transparent pixels if, for each of said at least one pattern repetition direction, at least one of a corresponding +1 diffraction order pixel and a corresponding −1 diffraction order pixel is within said numerical aperture at a first marking step;

marking, employing said one or more processor units, all pixels within said at least one set and within said numerical aperture in said pupil coordinate system as opaque pixels if, for any of said at least one pattern repetition direction, none of a corresponding +1 diffraction order pixel and a corresponding −1 diffraction order pixel is within said numerical aperture at a second marking step; and generating a pupil filter design in which all areas corresponding to said transparent pixels are transparent, and all areas corresponding to said opaque pixels are opaque.

2. The lithographic system according to claim 1, wherein said at least one pattern repetition direction consists of a single direction, and said periodic pattern is a one-dimensional array of repetitions of a line and a space.

3. The lithographic system according to claim 1, wherein said at least one pattern repetition direction comprises two directions, and said periodic pattern is a two-dimensional array of contact holes.

4. The lithographic system according to claim 1, wherein said generation of said design further comprises setting areas including pixels that are not marked as transparent pixels and not marked as opaque pixels during said first and second marking steps as opaque areas in said pupil filter design.

5. The lithographic system according to claim 1, wherein said generation of said design further comprises setting areas including pixels that are not marked as transparent pixels and not marked as opaque pixels during said first and second marking steps as transparent areas in said pupil filter design.

6. A method of operating a lithographic system, said method comprising:
providing a lithographic exposure tool, said lithographic exposure tool comprising a pupil lens including a pupil filter for use with a lithographic mask, the pupil filter having a design generated by:
selecting, employing one or more processor units, each pixel within an area of a source image of said lithographic exposure tool in a pupil coordinate system, one at a time; and
for each selected pixel within said area of said source image,
determining, employing said one or more processor units, and for each of at least one pattern repetition direction in said lithographic mask, locations of a set of a +1 diffraction order pixel and a −1 diffraction order pixel corresponding to a pitch of a periodic pattern in said lithographic mask;
marking, employing said one or more processor units, all pixels within said at least one set and within a numerical aperture in said pupil coordinate system as transparent pixels if, for each of said at least one pattern repetition direction, at least one of a corresponding +1 diffraction order pixel and a corresponding −1 diffraction order pixel is within said numerical aperture at a first marking step;
marking, employing said one or more processor units, all pixels within said at least one set and within said numerical aperture in said pupil coordinate system as opaque pixels if, for any of said at least one pattern repetition direction, none of a corresponding +1 diffraction order pixel and a corresponding −1 diffraction order pixel is within said numerical aperture at a second marking step; and
generating a pupil filter design in which all areas corresponding to said transparent pixels are transparent, and all areas corresponding to said opaque pixels are opaque;
loading a substrate with a photoresist layer thereupon into said lithographic exposure tool; and
lithographically exposing said photoresist layer employing said lithographic exposure tool and said pupil lens.

7. The method according to claim 6, wherein said at least one pattern repetition direction consists of a single direction, and said periodic pattern is a one-dimensional array of repetitions of a line and a space.

8. The method according to claim 6, wherein said at least one pattern repetition direction comprises two directions, and said periodic pattern is a two-dimensional array of contact holes.

9. The method according to claim 6, wherein said generation of said design further comprises setting areas including pixels that are not marked as transparent pixels and not marked as opaque pixels during said first and second marking steps as opaque areas in said pupil filter design.

10. The method according to claim 6, wherein said generation of said design further comprises setting areas including pixels that are not marked as transparent pixels and not marked as opaque pixels during said first and second marking steps as transparent areas in said pupil filter design.

11. A lithographic system comprising a lithographic exposure tool, said lithographic exposure tool comprising a pupil lens including a pupil filter for use with a lithographic mask, said pupil filter having a design generated by:
marking all pixels within an area of a source image of said lithographic exposure tool in a pupil coordinate system as opaque pixels;
selecting, employing one or more processor units, each pixel within an area of a source image of said lithographic exposure tool in a pupil coordinate system, one at a time; and
for each selected pixel within said area of said source image,
determining, employing said one or more processor units, and for each of at least one pattern repetition direction in said lithographic mask, locations of a set of a +1 diffraction order pixel and a −1 diffraction order pixel corresponding to a pitch of a periodic pattern in said lithographic mask;
marking, employing said one or more processor units, all pixels within said at least one set and within a numerical aperture in said pupil coordinate system as transparent pixels if, for each of said at least one pattern repetition direction, all of a corresponding +1 diffraction order pixel and a corresponding −1 diffraction order pixel is within said numerical aperture but not within said source image at a first marking step;
marking, employing said one or more processor units, all pixels within said at least one set and within said numerical aperture in said pupil coordinate system as additional opaque pixels if, for any of said at least one pattern repetition direction, at least one of a corresponding +1 diffraction order pixel and a corresponding −1 diffraction order pixel is not within said numerical aperture or is within said source image at a second marking step; and
generating a pupil filter design in which all areas corresponding to said transparent pixels are transparent, and all areas corresponding to said opaque pixels and said additional opaque pixels are opaque.

12. The lithographic system according to claim 11, wherein said at least one pattern repetition direction consists of a single direction, and said periodic pattern is a one-dimensional array of repetitions of a line and a space.

13. The lithographic system according to claim 11, wherein said at least one pattern repetition direction comprises two directions, and said periodic pattern is a two-dimensional array of contact holes.

14. The lithographic system according to claim 11, wherein said generation of said design further comprises setting areas including pixels that are not marked as transparent pixels and not marked as opaque pixels during said first and second marking steps as opaque areas in said pupil filter design.

15. The lithographic system according to claim 11, wherein said generation of said design further comprises setting areas including pixels that are not marked as transparent pixels and not marked as opaque pixels during said first and second marking steps as transparent areas in said pupil filter design.

16. A method of operating a lithographic system, said method comprising:
providing a lithographic exposure tool, said lithographic exposure tool comprising a pupil lens including a pupil filter for use with a lithographic mask, said pupil filter having a design generated by:
marking all pixels within an area of a source image of said lithographic exposure tool in a pupil coordinate system as opaque pixels;
selecting, employing one or more processor units, each pixel within an area of a source image of said lithographic exposure tool in a pupil coordinate system, one at a time; and
for each selected pixel within said area of said source image,
determining, employing said one or more processor units, and for each of at least one pattern repetition direction in said lithographic mask, locations of a set of a +1 diffraction order pixel and a −1 diffraction order pixel corresponding to a pitch of a periodic pattern in said lithographic mask;
marking, employing said one or more processor units, all pixels within said at least one set and within a numerical aperture in said pupil coordinate system as transparent pixels if, for each of said at least one pattern repetition direction, all of a corresponding +1 diffraction order pixel and a corresponding −1 diffraction order pixel is within said numerical aperture but not within said source image at a first marking step;
marking, employing said one or more processor units, all pixels within said at least one set and within said numerical aperture in said pupil coordinate system as additional opaque pixels if, for any of said at least one pattern repetition direction, at least one of a corresponding +1 diffraction order pixel and a corresponding −1 diffraction order pixel is not within said numerical aperture or is within said source image at a second marking step; and
generating a pupil filter design in which all areas corresponding to said transparent pixels are transparent, and all areas corresponding to said opaque pixels and said additional opaque pixels are opaque;
loading a substrate with a photoresist layer thereupon into said lithographic exposure tool; and
lithographically exposing said photoresist layer employing said lithographic exposure tool.

17. The method according to claim 16, wherein said at least one pattern repetition direction consists of a single direction, and said periodic pattern is a one-dimensional array of repetitions of a line and a space.

18. The method according to claim 16, wherein said at least one pattern repetition direction comprises two directions, and said periodic pattern is a two-dimensional array of contact holes.

19. The method according to claim 16, wherein said generation of said design further comprises setting areas including pixels that are not marked as transparent pixels and not marked as opaque pixels during said first and second marking steps as opaque areas in said pupil filter design.

20. The method according to claim 16, wherein said generation of said design further comprises setting areas including pixels that are not marked as transparent pixels and not marked as opaque pixels during said first and second marking steps as transparent areas in said pupil filter design.

* * * * *